US012733259B2

(12) United States Patent
Xie et al.

(10) Patent No.: US 12,733,259 B2
(45) Date of Patent: Sep. 8, 2026

(54) DISPLAY SUBSTRATE AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Jianyun Xie, Beijing (CN); Guodong Wang, Beijing (CN); Jingyi Xu, Beijing (CN); Chao Liang, Beijing (CN); Aiyu Ding, Beijing (CN); Yongqiang Zhang, Beijing (CN); Lei Yao, Beijing (CN); Hong Liu, Beijing (CN); Peng Liu, Beijing (CN); Bo Huang, Beijing (CN); Jiantao Liu, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 679 days.

(21) Appl. No.: 18/029,560

(22) PCT Filed: Jun. 17, 2022

(86) PCT No.: PCT/CN2022/099584
§ 371 (c)(1),
(2) Date: Mar. 30, 2023

(87) PCT Pub. No.: WO2023/240635
PCT Pub. Date: Dec. 21, 2023

(65) Prior Publication Data

US 2024/0363648 A1 Oct. 31, 2024

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136286* (2013.01); *G02F 1/1368* (2013.01); *H10D 86/443* (2025.01)

(58) Field of Classification Search
CPC .................. H10D 86/60; H10D 86/443; G02F 1/136286; G02F 1/1368; H10K 50/10
See application file for complete search history.

(56) References Cited

U.S. PATENT DOCUMENTS

2013/0148049 A1 6/2013 Abe et al.
2016/0190166 A1 6/2016 Kim et al.
(Continued)

FOREIGN PATENT DOCUMENTS

CN 103034003 A 4/2013
CN 107818988 A 3/2018
(Continued)

*Primary Examiner* — Tucker J Wright
(74) *Attorney, Agent, or Firm* — ArentFox Schiff LLP; Michael Fainberg

(57) ABSTRACT

The present disclosure provides a display substrate and a display apparatus. The display substrate includes a base substrate, including a display region and a frame region located on at least one side of the display region; a transistor, located on the base substrate, wherein the transistor is located in the display region and includes a gate, a first electrode and an active layer; and a protective structure, located on the base substrate, wherein the protective structure is provided in the frame region and close to the display region, and the protective structure is in the same layer as and is made of the same material as at least one of the active layer, the gate or the first electrode.

20 Claims, 20 Drawing Sheets

(51) Int. Cl.

| | |
|---|---|
| ***G02F 1/1368*** | (2006.01) |
| ***H10D 86/40*** | (2025.01) |

(56) References Cited

U.S. PATENT DOCUMENTS

| | | | |
|---|---|---|---|
| 2017/0062598 | A1 | 3/2017 | Seo |
| 2018/0090091 | A1 | 3/2018 | Sim et al. |
| 2019/0165072 | A1 | 5/2019 | Wang |
| 2021/0036077 | A1 | 2/2021 | Xu et al. |

FOREIGN PATENT DOCUMENTS

| | | | | |
|---|---|---|---|---|
| CN | 107863357 | A | * | 3/2018 |
| CN | 108957887 | A | | 12/2018 |
| CN | 110416227 | A | | 11/2019 |
| CN | 112397453 | A | | 2/2021 |
| JP | 2019095773 | A | | 6/2019 |
| KR | 20080060524 | A | | 7/2008 |
| KR | 20180035966 | A | | 4/2018 |

* cited by examiner

23

250μm

31(103)

DISPLAY SUBSTRATE AND DISPLAY APPARATUS

The present application is a National Stage of International Application No. PCT/CN2022/099584, filed on Jun. 17, 2022, which is hereby incorporated by reference in its entirety.

FIELD

The present disclosure relates to the technical field of display, in particular to a display substrate and a display apparatus.

BACKGROUND

A liquid crystal display (LCD) has advantages of less weight, low power consumption, high image quality, low radiation, easy carrying and the like, and it has gradually replaced a traditional cathode ray tube (CRT) display and is widely applied to modern information devices, such as a virtual reality (VR) headworn display device, a laptop, a television, a mobile phone and a digital product.

SUMMARY

Embodiments of the present disclosure provide a display substrate and a display apparatus, and a specific solution is as follows.

In an aspect, an embodiment of the present disclosure provides a display substrate, including: a base substrate, including a display region and a frame region on at least one side of the display region; a transistor on the base substrate, wherein the transistor is in the display region, and includes a gate, a first electrode and an active layer; and a protective structure, on the base substrate, wherein the protective structure is provided in the frame region and close to the display region, and the protective structure is in the same layer as and is made of the same material as at least one of the active layer, the gate or the first electrode.

In some embodiments, in the above display substrate provided by the embodiment of the present disclosure, the frame region surrounds the display region, and the protective structure in the frame region surrounds the display region.

In some embodiments, in the above display substrate provided by the embodiment of the present disclosure, the frame region includes: a first frame region and a second frame region which are provided oppositely, and a third frame region and a fourth frame region which are provided oppositely, the third frame region is connected with the first frame region and the second frame region, and the fourth frame region is connected with the first frame region and the second frame region; the display substrate further includes a gate line that is in the same layer as and is made of the same material as the gate, and a data line that is in the same layer as and is made of the same material as the first electrode, an extension direction of the gate line intersects with an extension direction of the data line, the gate line penetrates through the display region and extends to the third frame region and/or the fourth frame region, and the data line penetrates through the display region and extends to the first frame region and the second frame region; and the protective structure includes a plurality of protective parts disconnected with one another in an extension direction of the protective structure; in the first frame region and the second frame region, orthographic projections of at least parts of disconnected positions between the protective parts on the base substrate overlap an orthographic projection of the data line on the base substrate; and in the third frame region and the fourth frame region, orthographic projections of at least parts of the disconnected positions between the protective parts on the base substrate overlap an orthographic projection of the gate line on the base substrate.

In some embodiments, in the above display substrate provided by the embodiment of the present disclosure, a shape of the orthographic projections of the protective parts on the base substrate is one or any combination of a straight line, a curve or a polyline.

In some embodiments, in the above display substrate provided by the embodiment of the present disclosure, the protective structure includes: a plurality of first sub-protective structures sequentially provided at intervals in a direction away from the display region, and in at least one of the first frame region, the second frame region, the third frame region or the fourth frame region, disconnected positions of at least parts of the first sub-protective structures are staggered.

In some embodiments, in the above display substrate provided by the embodiment of the present disclosure, in at least one of the first frame region, the second frame region, the third frame region or the fourth frame region, disconnected positions of the adjacent first sub-protective structures are staggered.

In some embodiments, in the above display substrate provided by the embodiment of the present disclosure, in at least one of the first frame region, the second frame region, the third frame region or the fourth frame region, disconnected positions of an $n^{th}$ first sub-protective structure in a direction away from the display region are provided in a direct facing mode, and n is an odd or even number.

In some embodiments, in the above display substrate provided by the embodiment of the present disclosure, in at least one of the first frame region, the second frame region, the third frame region or the fourth frame region, disconnected positions of all the first sub-protective structures are staggered.

In some embodiments, in the above display substrate provided by the embodiment of the present disclosure, the protective structure is in the same layer as and is made of the same material as the active layer, and in the first frame region, the second frame region, the third frame region and the fourth frame region, the disconnected positions of at least parts of the first sub-protective structures are staggered.

In some embodiments, in the above display substrate provided by the embodiment of the present disclosure, the protective structure is in the same layer as and is made of the same material as the gate, and in the first frame region and the second frame region, the disconnected positions of at least parts of the first sub-protective structures are staggered; and in the third frame region and the fourth frame region, at least parts of the disconnected positions of each first sub-protective structure are provided in a direct facing mode, and the gate line extends to at least parts of the disconnected positions which are provided in a direct facing mode and is not in contact with the protective parts.

In some embodiments, in the above display substrate provided by the embodiment of the present disclosure, the protective structure is in the same layer as and is made of the same material as the first electrode, in the first frame region and the second frame region, the disconnected positions of all the first sub-protective structures are provided in a direct facing mode, and the data line extends to at least parts of the disconnected positions which are provided in a direct facing mode and is not in contact with the protective parts; and in the third frame region and the fourth frame region, the disconnected positions of at least parts of the first sub-protective structures are staggered.

In some embodiments, in the above display substrate provided by the embodiment of the present disclosure, the protective structure and the active layer, the gate or the first electrode in the same layer meet the following relational expression:

$$\frac{S_{TFT}}{S_{Pixel}} = \frac{W}{W+S};$$

wherein, $S_{TFT}$ represents an area of an orthographic projection of the active layer, the gate or the first electrode in the same layer as the protective structure contained in a single pixel in the display region on the base substrate, $S_{pixel}$ represents an area of the single pixel, W represents a line width of each protective part, and S represents a spacing distance between two adjacent first sub-protective structures in the direction away from the display region.

In some embodiments, the above display substrate provided by the embodiment of the present disclosure further includes an electrostatic ring, and an orthographic projection of the electrostatic ring on the base substrate is in an orthographic projection of a gap of the first sub-protective structures on the base substrate.

In some embodiments, in the above display substrate provided by the embodiment of the present disclosure, the frame region surrounds the display region, and a shape of the frame region is a rectangle hollowed out in the display region; and the protective structure is provided around four corners of the display region at four corner positions of the rectangle.

In some embodiments, in the above display substrate provided by the embodiment of the present disclosure, the protective structure includes a plurality of second sub-protective structures, and a distribution density of the second sub-protective structures in a region where the protective structure is located is approximately the same as a distribution density of the active layer, the gate or the first electrode provided in the same layer in the display region.

In some embodiments, in the above display substrate provided by the embodiment of the present disclosure, a shape of the second sub-protective structures is approximately the same as a shape of the active layer, the gate or the first electrode provided in the same layer.

In some embodiments, in the above display substrate provided by the embodiment of the present disclosure, an included angle between the orthographic projection of the protective structure on the base substrate and sides among the four corners of the display region is an obtuse angle.

In some embodiments, in the above display substrate provided by the embodiment of the present disclosure, the frame region on one side includes a plurality of rows of second sub-protective structures sequentially provided in the direction away from the display region, and quantities of the second sub-protective structures in the rows in the direction away from the display region are sequentially decreased at two ends of an extension direction of the protective structure.

In some embodiments, in the above display substrate provided by the embodiment of the present disclosure, a length of the protective structure in the extension direction of the protective structure is greater than or equal to 2 times a width of the display region affected by diffraction light.

In some embodiments, in the above display substrate provided by the embodiment of the present disclosure, the frame region includes: a first frame region and a second frame region which are provided oppositely, and a third frame region and a fourth frame region which are provided oppositely, the third frame region is connected with the first frame region and the second frame region, and the fourth frame region is connected with the first frame region and the second frame region; the first frame region includes a multiplexing circuit, the second frame region includes a testing circuit, the third frame region includes a first gate driving circuit, and the fourth frame region includes a second gate driving circuit; and a width of the protective structure in the direction away from the display region is greater than or equal to the width of the display region affected by the diffraction light, and the orthographic projection of the protective structure on the base substrate does not overlap an orthographic projection of the multiplexing circuit on the base substrate, an orthographic projection of the testing circuit on the base substrate, an orthographic projection of the first gate driving circuit on the base substrate and an orthographic projection of the second gate driving circuit on the base substrate.

In some embodiments, the above display substrate provided by the embodiment of the present disclosure further includes an electrostatic ring in the third frame region and the fourth frame region, wherein an orthographic projection of the electrostatic ring on the base substrate is between the orthographic projection of the protective structure on the base substrate and the display region.

In some embodiments, the above display substrate provided by the embodiment of the present disclosure further includes an electrostatic ring in the third frame region and the fourth frame region, wherein an orthographic projection of the electrostatic ring on the base substrate is between the orthographic projection of the protective structure on the base substrate and the orthographic projection of the first gate driving circuit on the base substrate, and between the orthographic projection of the protective structure on the base substrate and the orthographic projection of the second gate driving circuit on the base substrate.

In some embodiments, in the above display substrate provided by the embodiment of the present disclosure, a shape of the orthographic projection of the active layer on the base substrate is approximately a U shape or a polyline shape.

In another aspect, an embodiment of the present disclosure provides a display apparatus, including the above display substrate provided by the embodiment of the present disclosure.

In some embodiments, in the above display apparatus provided by the embodiment of the present disclosure, the display apparatus is virtual reality glasses; the virtual reality glasses include one display substrate for providing pictures for the left eye and another display substrate for providing pictures for the right eye; or, the virtual reality glasses include a display substrate, and a display region of the display substrate includes a left-eye pixel region for providing pictures for the left eye and a right-eye pixel region for providing pictures for the right eye.

DETAILED DESCRIPTION OF THE EMBODIMENTS

Figure 1:
FIG. 1 is a picture of an active layer in the related art.

To make objectives, technical solutions and advantages of embodiments of the present disclosure clearer, the technical solutions of the embodiments of the present disclosure will be clearly and completely described below in conjunction with accompanying drawings of the embodiments of the present disclosure. It needs to be noted that sizes and shapes of all figures in the accompanying drawings do not reflect true scales, and are only intended to schematically illustrate the content of the present disclosure. The same or similar reference numerals represent the same or similar elements or elements with the same or similar functions all the time. In order to keep the following descriptions of the embodiments of the present disclosure clear and concise, detailed descriptions of known functions and known components are omitted.

Unless otherwise defined, technical or scientific terms used herein shall have the ordinary meanings understood by those ordinarily skilled in the art to which the present disclosure pertains. The words "first", "second" and the similar words used in specification and claims of the present disclosure do not indicate any order, quantity or importance, but are only used to distinguish different components. The words "comprise" or "include" and the like indicate that an element or item appearing before such the word covers listed elements or items appearing after the word and equivalents thereof, and does not exclude other elements or items. "Inner", "outer", "upper" and "lower" and the like are only used to represent relative position relationships, and the relative position relationships may also change accordingly after an absolute position of a described object is changed.

Due to a small pixel size of an ultra-high pixels-per-inch (PPI) product, the size of each film layer in a display region (AA) of the product is small. In a process of exposure and development, a film layer (such as an active layer) at an edge of the display region often has a badness of crack. As shown in FIG. 1, after exposure and development, a pattern of the active layer may be retained at a corner position and a connection point position, and other positions that are designed to be thin are cracked, resulting in serious defects of the ultra-high PPI product.

Figure 2:
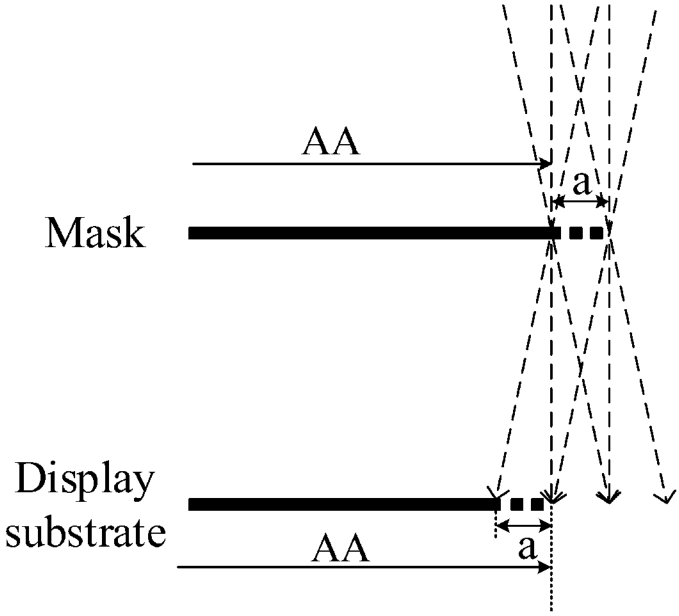
FIG. 2 is a schematic diagram of diffraction at an edge of a display region.

The reason is that the pattern of the active layer is mainly made by two steps of mask exposure and development, a light diffraction phenomenon in the exposure process and a catalyst density in the development process are main factors that affect the pattern of the active layer. In the exposure process, light is emitted from a light resource and passes through a mask to irradiate a photo-sensitive resist on a surface of a display substrate, when the light encounters an obstacle, the light will deviate from a path of linear propagation and propagate behind the obstacle, so as to generate the light diffraction phenomenon. An ultra-high PPI display region has a dense pixel design, and the mask is equivalent to a large obstacle, so a diffraction phenomenon will be generated at the edge of the display region. In the ultra-high PPI product, the light diffraction phenomenon at the edge of a single side of the display region is as shown in FIG. 2. In FIG. 2, a region shown by a width a in the display substrate is an edge region with a width a affected by diffraction light in the display region, the irradiation of the diffraction light causes that an active layer at the edge of the display region is provided with a line width smaller than a line width of an active layer at a center of the display region after exposure, and may be even cracked. In addition, after exposure is completed, development needs to be performed. When the mask is designed to be sparse or not designed, there will be a large area of photo-sensitive development, and a high-density catalyst is generated; and when the mask is designed to be dense, the area of photo-sensitive development is small, and a low-density catalyst is generated. Due to permeation, a catalyst density in a low-density region may gradually increase due to influence of a catalyst density in a high-density region, which affects the development process of the low-density region. In the design of the ultra-high PPI product, the active layer is designed densely in the display region, the active layer is also designed densely in parts of frame regions (a GOA region, an MUX region and a CT region) close to the display region, and the catalyst density in the development process is low; and in other parts, such as corner regions corresponding to GOA and MUX (the active layer is not designed or the active layer is designed to be low in density), of frame regions close to the display region, the catalyst density in the development process is high. Due to permeation, a catalyst in the region with a high catalyst density may enter the region with a low catalyst density. In parts of the frame regions (the GOA region, the MUX region and the CT region), due to the dense design of the active layer, which has a certain effect of shielding the catalyst permeation, the catalyst density in the display region will increase because it is more prone to being affected by permeation, which causes that an active layer at the outermost edge, especially the corner regions, such as the corner regions corresponding to GOA and MUX, of the display region are over-developed, resulting in pattern crack of the active layer.

Figure 3:
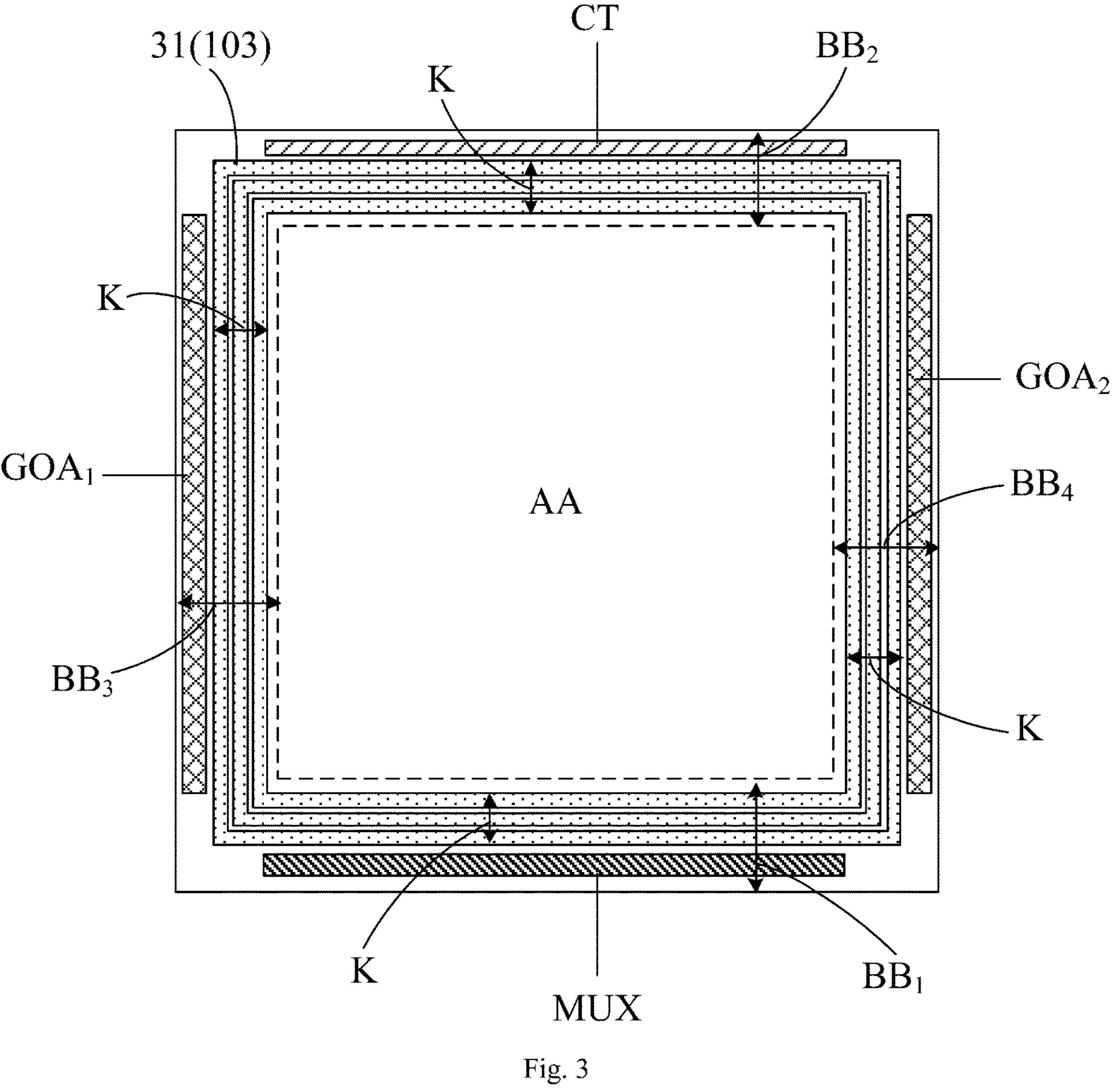
FIG. 3 is a schematic structural diagram of a display substrate provided by an embodiment of the present disclosure.
Figure 4:
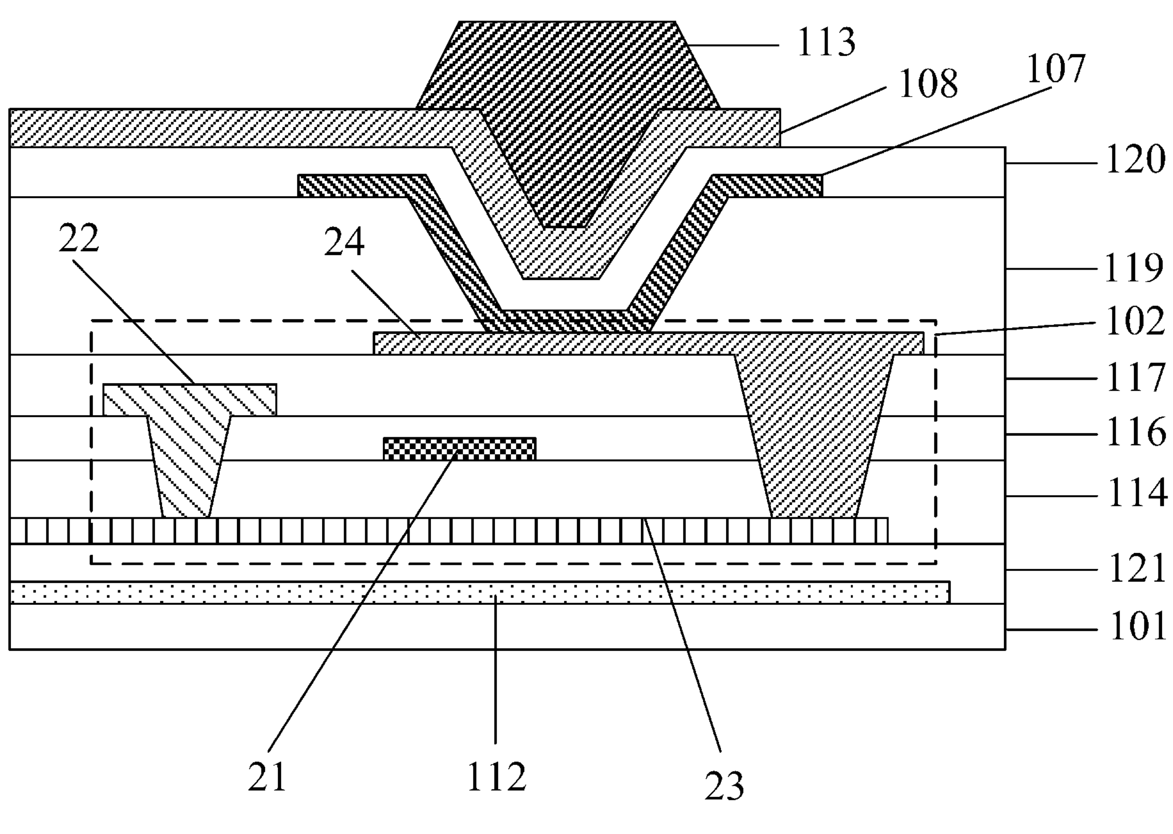
FIG. 4 is a schematic structural diagram of one sub-pixel in an effective pixel region.

In order to improve the above technical problems existing in the related art, an embodiment of the present disclosure provides a display substrate, as shown in FIG. 3 and FIG. 4, including: a base substrate 101, wherein the base substrate 101 includes a display region AA and a frame region (such as $BB_1$, $BB_2$, $BB_3$ and $BB_4$) on at least one side of the display region AA; a transistor 102, on the base substrate 101, wherein the transistor 102 is in the display region AA, and includes a gate 21, a first electrode 22 and an active layer 23. Optionally, the active layer 23 may be a polysilicon (Poly) active layer, an oxide active layer or the like, materials of the gate 21 and the first electrode 22 both may include a metal material or an alloy material, for example, the gate 21 and the first electrode 22 are of a single-layer metal structure or a multi-layer metal structure formed by molybdenum, aluminum, titanium and the like, and exemplarily, the multi-layer metal structure is composed of a titanium metal layer, an aluminum metal layer and a titanium metal layer which are provided in a stacked mode; and a protective structure 103 on the base substrate 101, wherein the protective structure 103 is provided in the frame region (such as $BB_1$, $BB_2$, $BB_3$ and $BB_4$) and close to the display region AA, and the protective structure 103 is in the same layer as and is made of the same material as at least one of the gate 21, the first electrode 22 or the active layer 23.

It should be noted that in the present disclosure, "the same layer and the same material" refers to a layer structure formed by the same mask through a single patterning process after forming a film layer for making a specific pattern by using the same film forming process. That is, the single patterning process corresponds to one mask (also known as a photomask). According to different specific patterns, a single patterning process may include multiple exposures, developments or etchings, the specific patterns in the formed layer structure may be successive or dissuccessive, and these specific patterns may be in the same height or have the same thickness, and may also be in different heights or have different thicknesses.

In the above display substrate provided by the embodiment of the present disclosure, the protective structure 103 is provided in the frame region BB (such as $BB_1$, $BB_2$, $BB_3$ and $BB_4$) and close to the display region AA, so that the exposed protective structure 103 and a mask of pixels in the display region AA form an obstacle. In an exposure process, light bypasses the obstacle and diffracts in the region where the protective structure 103 is located, and thus it is ensured that the display region AA is not affected by diffraction light. In a development process, because the protective structure 103 is provided close to the display region AA, on a side of the protective structure 103 away from the display region AA, a high-density catalyst generated by large-area development may penetrate into the region where the protective structure 103 is located. Due to an isolation effect of the protective structure 103, a catalyst density in the display region AA may not be affected by the high-density catalyst, and thus it may be ensured that the display region AA can be developed according to the normal catalyst density. Based on this, the protective structure 103 is provided in the frame region (such as $BB_1$, $BB_2$, $BB_3$ and $BB_4$) and close to the display region AA, so that the gate 21, the first electrode 22, the active layer 23 and the like, that are in the display region AA, in the same layer as the protective structure 103 may be protected and isolated in the two processes of exposure and development, line breakage in the gate 21, the first electrode 22, the active layer 23 and the like in the display region AA is avoided, and a product yield is improved.

Figure 5:
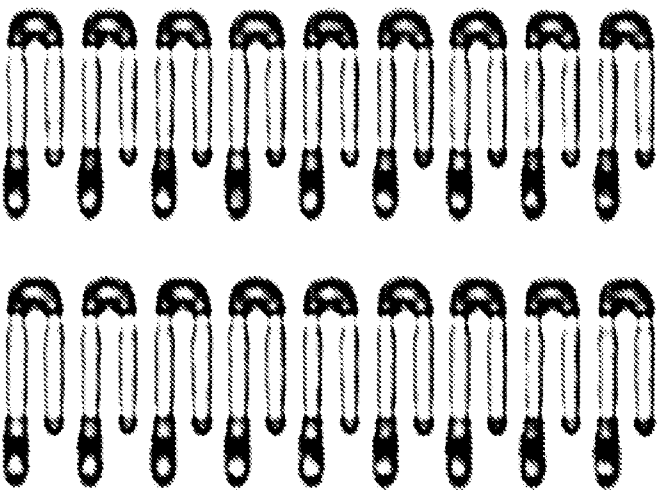
FIG. 5 is a picture of an active layer provided by an embodiment of the present disclosure.

Optionally, the present disclosure provides a picture of the active layer 23 made by the solution of the present disclosure, as shown in FIG. 5. By comparing a badness of crack picture of the active layer 23 in the related art shown in FIG. 1, it may be found that the active layer 23 made by the technical solution of the present disclosure has no crack, and an occurrence rate of a badness of crack of the active layer 23 of an ultra-high PPI product is greatly reduced.

It should be noted that in order to completely avoid the effect of the diffraction light on the gate 21, the first electrode 22, the active layer 23 and the like in the display region AA, a width K of the region where the protective structure 103 is located shown in FIG. 3 should be greater than or equal to a width a in the display region AA affected by the diffraction light shown in FIG. 2.

Figure 6:
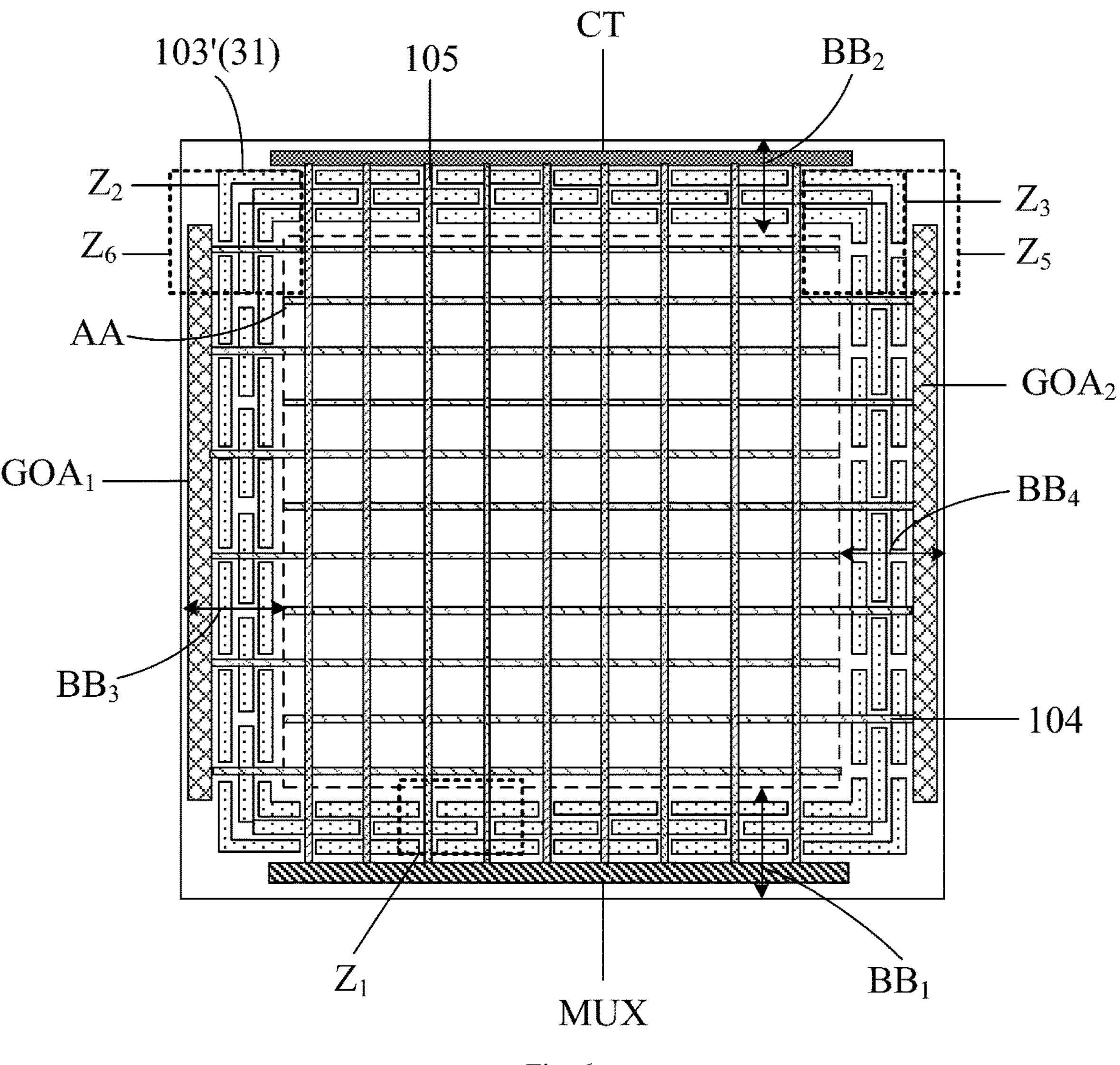
FIG. 6 is yet another schematic structural diagram of a display substrate provided by an embodiment of the present disclosure.
Figure 7:
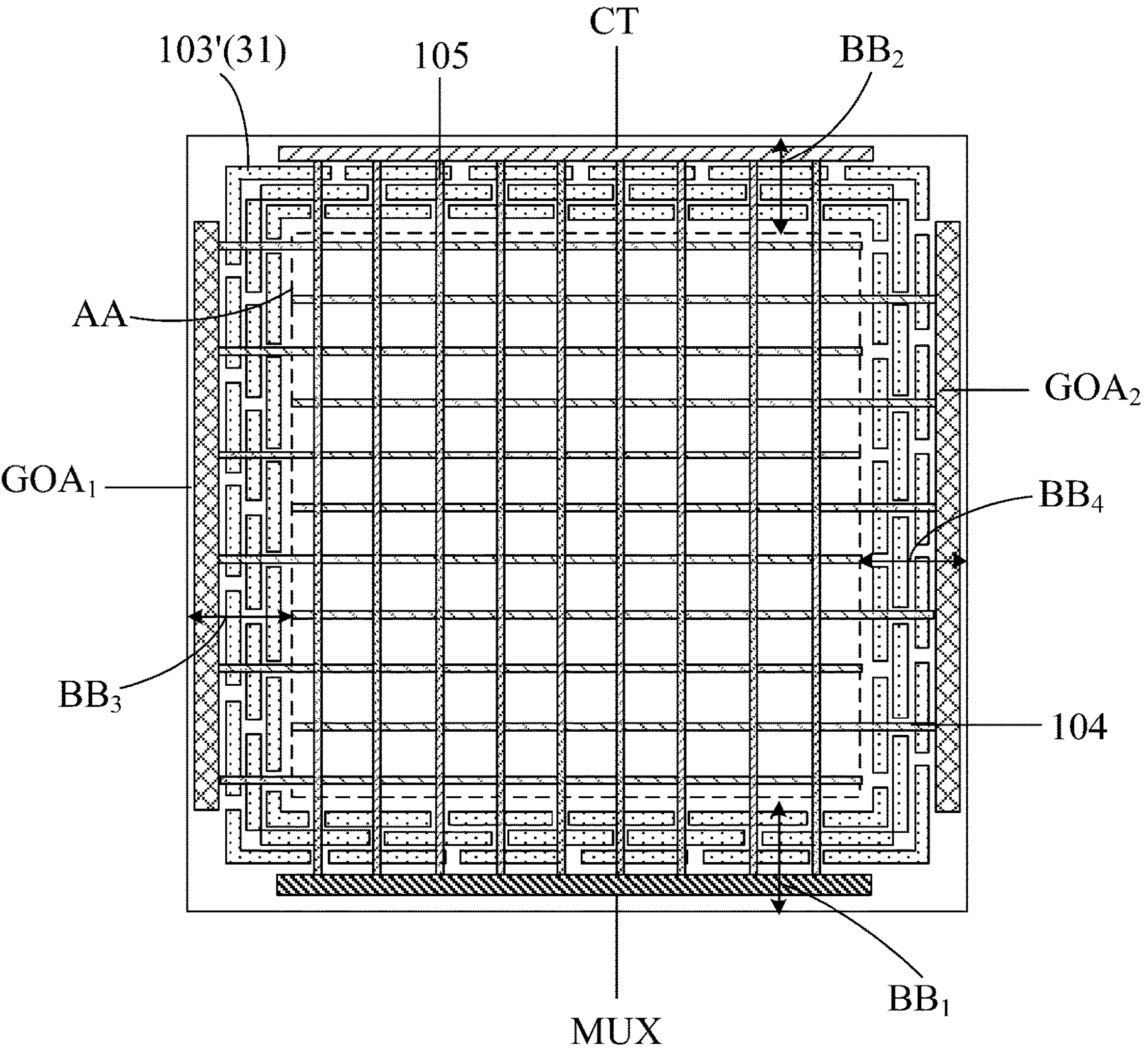
FIG. 7 is yet another schematic structural diagram of a display substrate provided by an embodiment of the present disclosure.

In some embodiments, in the above display substrate provided by the embodiment of the present disclosure, as shown in FIG. 3, FIG. 6 and FIG. 7, the frame region (such as $BB_1$, $BB_2$, $BB_3$ and $BB_4$) may surround the display region AA, the protective structure 103 may be provided in the frame region (such as $BB_1$, $BB_2$, $BB_3$ and $BB_4$) to surround the display region AA, so as to protect and isolate an edge of the display region AA in all directions through the protective structure 103 provided in a whole circle, so that a line breakage probability in the gate 21, the first electrode 22, the active layer 23 and the like, that are in the display region AA, in the same layer as the protective structure 103 is effectively reduced.

In some embodiments, in the above display substrate provided by the embodiment of the present disclosure, as shown in FIG. 6 and FIG. 7, the frame region includes: a first frame region $BB_1$ and a second frame region $BB_2$ which are provided oppositely, and a third frame region $BB_3$ and a fourth frame region $BB_4$ which are provided oppositely, the third frame region $BB_3$ is connected with the first frame region $BB_1$ and the second frame region $BB_2$, and the fourth frame region $BB_4$ is connected with the first frame region $BB_1$ and the second frame region $BB_2$; a gate line 104 of the display region AA extends to the third frame region $BB_3$ and/or the fourth frame region $BB_4$, so as to be electrically connected with a first gate driving circuit $GOA_1$ of the third frame region $BB_3$, or/and be electrically connected with a second gate driving circuit $GOA_2$ of the fourth frame region $BB_4$; and a data line 105 of the display region AA extends to the first frame region $BB_1$ and the second frame region $BB_2$, so as to be electrically connected with a multiplexing circuit MUX of the first frame region $BB_1$ and a testing circuit CT of the second frame region $BB_2$ respectively. In the present disclosure, an orthographic projection of the protective structure 103 which is provided in the whole circle in the frame region (such as $BB_1$, $BB_2$, $BB_3$ and $BB_4$) on the base substrate 101 may overlap an orthographic projection of an extension line of the gate line 104 on the base substrate 101 and an orthographic projection of an extension line of the data line 105 on the base substrate 101, resulting in the formation of a parasitic capacitance between the protective structure 103 and the extension line of the gate line 104, as well as the extension line of the data line 105, and existence of the parasitic capacitance may interfere a signal on the gate line 104 and a signal on the data line 105, thereby affecting a display effect. Based on this, the protective structure 103 provided in the present disclosure includes a plurality of protective parts 103' provided in a disconnected mode in an extension direction of the protective structure 103, and in the first frame region $BB_1$ and the second frame region $BB_2$, orthographic projections of at least parts of disconnected positions between the protective parts 103' on the base substrate 101 overlap an orthographic projection of the data line 105 on the base substrate 101; and in the third frame region $BB_3$ and the fourth frame region $BB_4$, orthographic projections of at least parts of the disconnected positions between the protective parts 103' on the base substrate 101 overlap an orthographic projection of the gate line 104 on the base substrate 101. In this way, a direct-facing area between the protective structure 103 and the extension line of the gate line 104, as well as the extension line of the data line 105 is reduced, which is conducive to reducing the parasitic capacitance between the protective structure 103 and the extension line of the gate line 104, as well as the extension line of the data line 105, and reducing the interference of the protective structure 103 to the signal on the gate line 104 and the signal on the data line 105, and the display effect is ensured.

Considering that a disconnection distance between the protective parts 103' is large, the catalyst density within the large disconnection distance in the development process is large, the low catalyst density in the display region may be affected, and therefore, the disconnection distance between the protective parts 103' in the present disclosure cannot be too large. Optionally, in order to maximize the parasitic capacitance between the protective parts 103' and the extension line of the gate line 104, as well as the extension line of the data line 105, the disconnection distance between the protective parts 103' may be equal to a line width of the extension line of the gate line 104 or the data line 105 overlapped with the disconnection distance. Considering the influence of factors such as alignment in a making process, the disconnection distance between the protective parts 103' may be slightly greater than the line width of the extension line of the gate line 104 or the data line 105 overlapped with the disconnection distance, for example, the maximum disconnection distance between the protective parts 103' is 1.2 times the line width of the extension line of the gate line 104 or the data line 105 overlapped with the disconnection distance. Optionally, the minimum disconnection distance between the protective parts 103' needs to meet a minimum spacing distance (such as 2 μm) that may be made by the process.

In some embodiments, in the above display substrate provided by the embodiment of the present disclosure, as shown in FIG. 6 to FIG. 10, the protective structure 103 includes: a plurality of first sub-protective structures 31 sequentially provided at intervals in a direction away from the display region AA, and in at least one of the first frame region $BB_1$, the second frame region $BB_2$, the third frame region $BB_3$ or the fourth frame region $BB_4$, disconnected positions of at least parts of the first sub-protective structures 31 are staggered. In this way, it is conducive to making the protective parts 103' of the first sub-protective structures 31 as evenly distributed as possible, so that it is ensured that a catalyst concentration of the region where the protective structure 103 is located is low in the development process, the catalyst concentration of the region where the protective structure 103 is located is prevented from affecting a catalyst concentration of the display region AA, and a normal development effect in the display region AA is ensured.

In some embodiments, in the above display substrate provided by the embodiment of the present disclosure, as shown in FIG. 6 to FIG. 10, and in at least one of the first frame region $BB_1$, the second frame region $BB_2$, the third frame region $BB_3$ or the fourth frame region $BB_4$, disconnected positions of the adjacent first sub-protective structures 31 may be staggered. Considering that the disconnected positions of the adjacent first sub-protective structures 31 are provided in a direct facing mode, it may cause a large overall area of the disconnected positions which are provided in a direct facing mode, and accordingly, a catalyst density at the disconnected positions which are provided in a direct facing mode in the development process is large, which may affect the low catalyst density in the display region AA. Therefore, in order to avoid the effect on the display region AA, in the present disclosure, the disconnected positions of the adjacent first sub-protective structures 31 are staggered. Optionally, as shown in FIG. 11, a minimum distance between the disconnected positions which are staggered in the adjacent first sub-protective structures 31 may be in a range of 200 μm-300 μm, e.g., 250 μm.

In some embodiments, in the above display substrate provided by the embodiment of the present disclosure, as shown in FIG. 6 to FIG. 10, in at least one of the first frame region $BB_1$, the second frame region $BB_2$, the third frame region $BB_3$ or the fourth frame region $BB_4$, disconnected positions of an $n^{th}$ first sub-protective structure 31 in the direction away from the display region AA are provided in a direct facing mode, the disconnected positions of the $n^{th}$ first sub-protective structure 31 and disconnected positions of an $(n+1)^{th}$ first sub-protective structure 31 are staggered, and n is an odd or even number. In this case, there is an even-numbered first sub-protective structure 31 between any two odd-numbered first sub-protective structures 31, although the disconnected positions of any two odd-numbered first sub-protective structures 31 are provided in a direct facing mode, the disconnected positions of the two are isolated by the even-numbered first sub-protective structure 31 between the two, which prevents the disconnected positions which are provided in a direct facing mode in the two from being connected into a large-area patternless region. Therefore, it may be ensured that uniformity of the catalyst concentration of the region where the protective structure 103 is located is good in the development process. Similarly, there is an odd-numbered first sub-protective structure 31 between any two even-numbered first sub-protective structures 31, although the disconnected positions of any two even-numbered first sub-protective structures 31 are provided in a direct facing mode, the disconnected positions of the two are isolated by the odd-numbered first sub-protective structure 31 between the two, which prevents the disconnected positions which are provided in a direct facing mode in the two from being connected into a large-area patternless region. Therefore, it may be ensured that uniformity of the catalyst concentration of the region where the protective structure 103 is located is good in the development process.

In some embodiments, in the above display substrate provided by the embodiment of the present disclosure, as shown in FIG. 7, in at least one of the first frame region $BB_1$, the second frame region $BB_2$, the third frame region $BB_3$ or the fourth frame region $BB_4$, disconnected positions of all the first sub-protective structures 31 may further be staggered, so as to prevent the disconnected positions of any two first sub-protective structures 31 from being connected into a large-area patternless region, so that it may be ensured that the uniformity of the catalyst concentration of the region where the protective structure 103 is located is good in the development process.

Figures 10, 11:
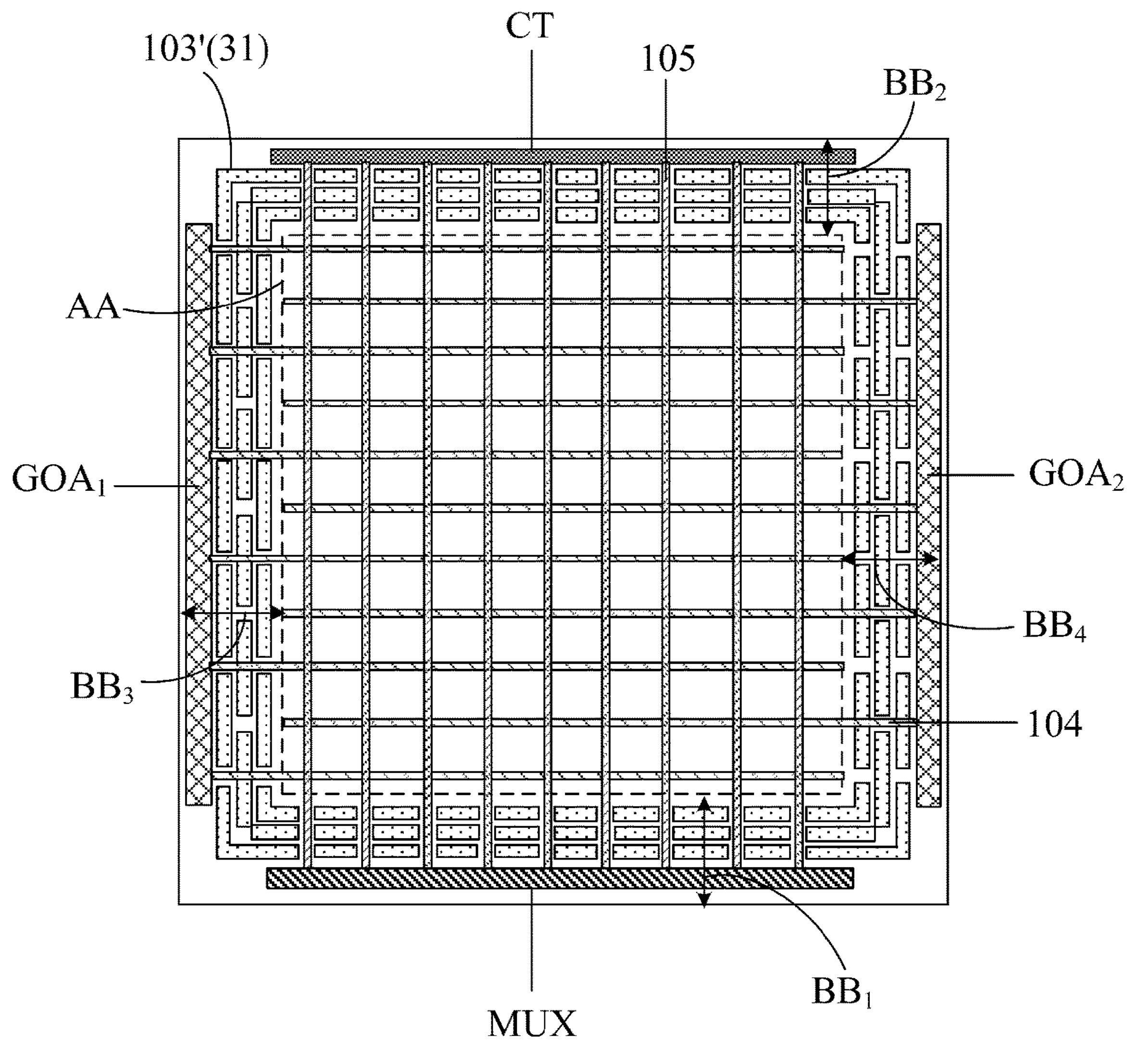
FIG. 10 is yet another schematic structural diagram of a display substrate provided by an embodiment of the present disclosure.
FIG. 11 is an enlarged schematic diagram of a region $Z_1$ in FIG. 6.
Figure 12:
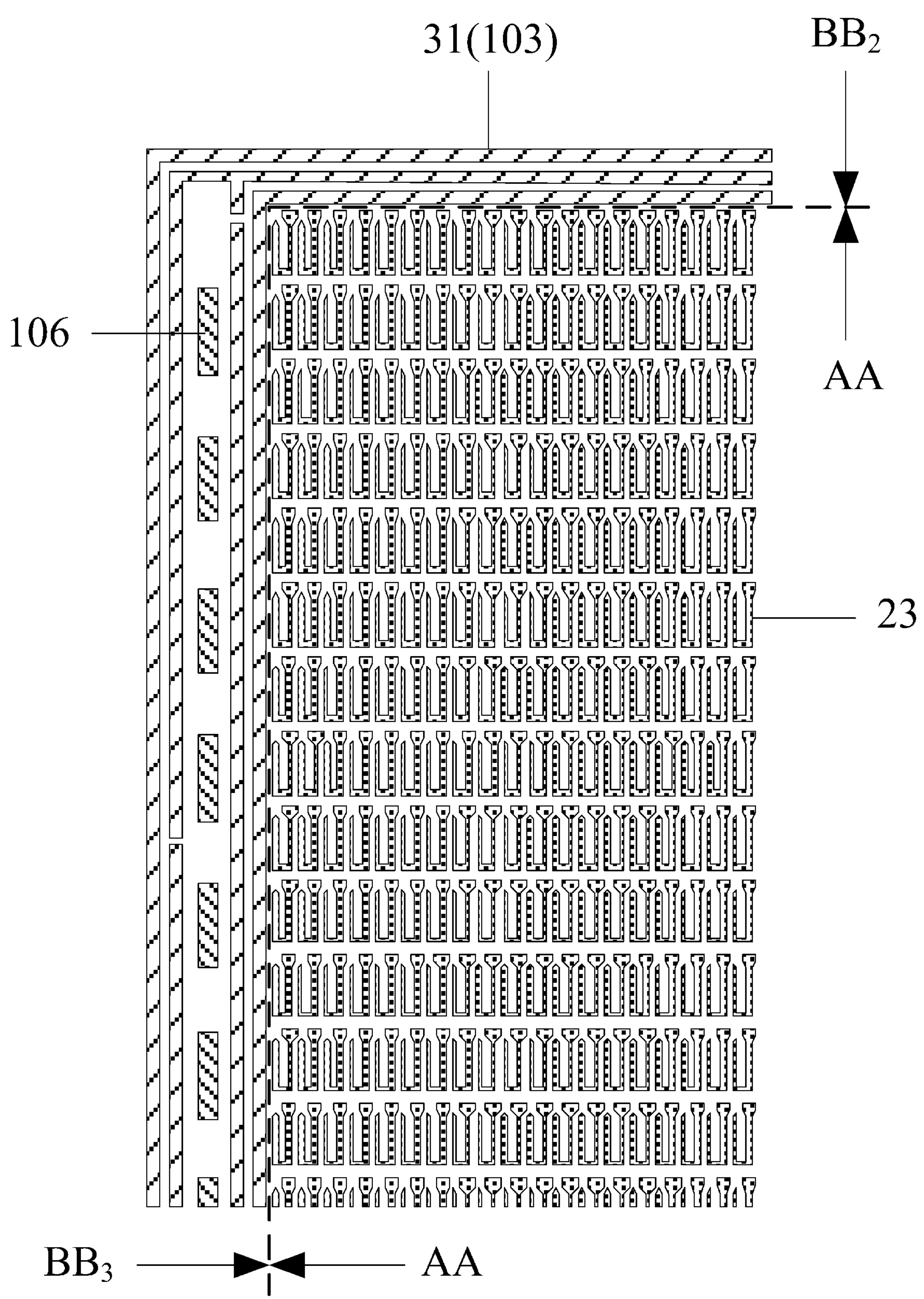
FIG. 12 is an enlarged schematic diagram of a region $Z_2$ in FIG. 6.
Figure 13:
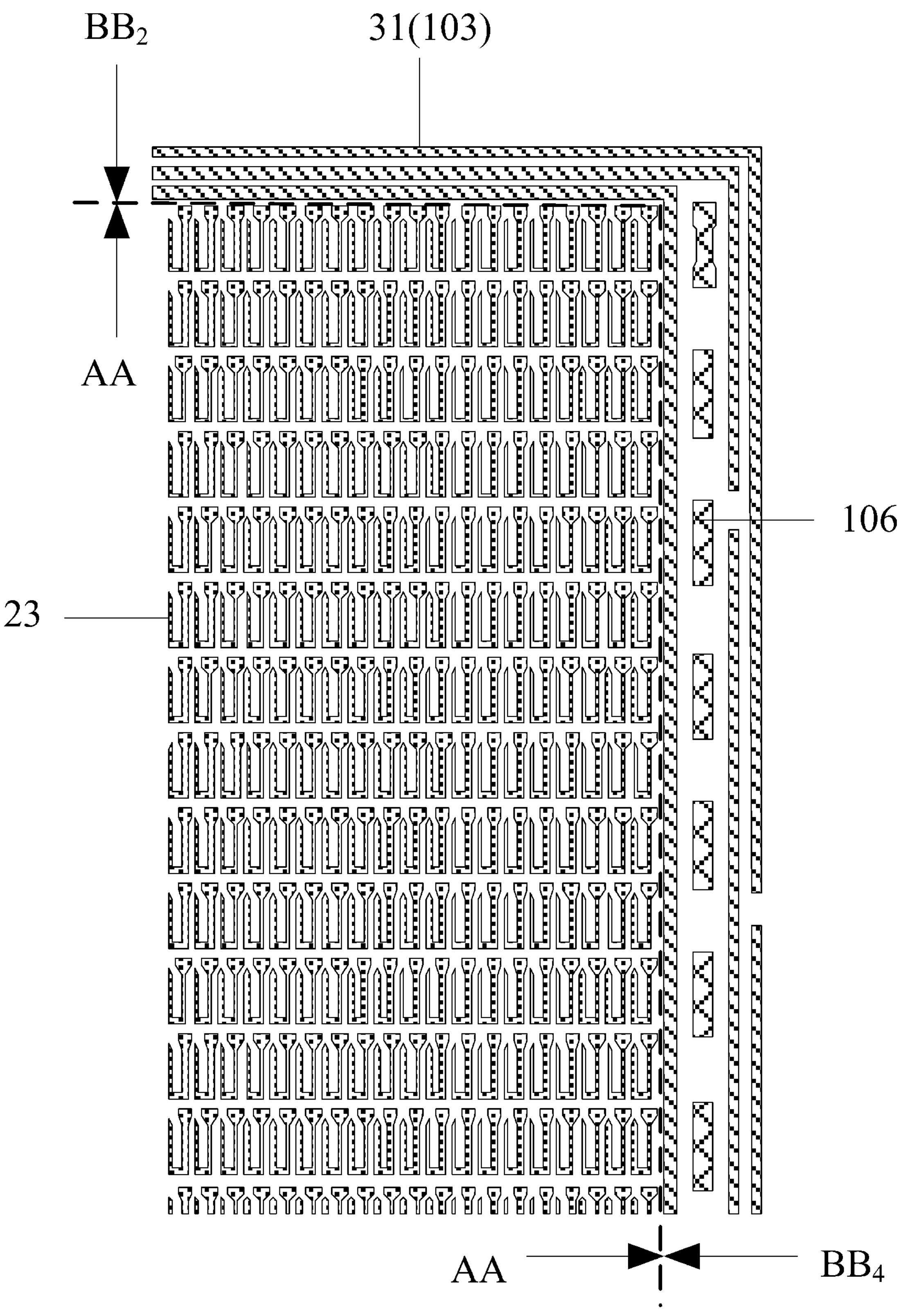
FIG. 13 is an enlarged schematic diagram of a region $Z_3$ in FIG. 6.

In some embodiments, in the above display substrate provided by the embodiment of the present disclosure, as shown in FIG. 11 to FIG. 13, the protective structure 103 may be in the same layer as and is made of the same material as the active layer 23, and as shown in FIG. 6 and FIG. 7, in the first frame region $BB_1$, the second frame region $BB_2$, the third frame region $BB_3$ and the fourth frame region $BB_4$, disconnected positions of at least parts of the first sub-protective structures 31 may all be staggered, so that the protective parts 103' of each first sub-protective structure 31 are uniformly distributed in the first frame region $BB_1$, the second frame region $BB_2$, the third frame region $BB_3$ and the fourth frame region $BB_4$ respectively, thus it is ensured that the catalyst concentration around the display region AA is low in the development process, the catalyst concentration around the display region AA is prevented from affecting the catalyst concentration of the display region AA, and the normal development effect of the display region AA is ensured.

Figure 8:
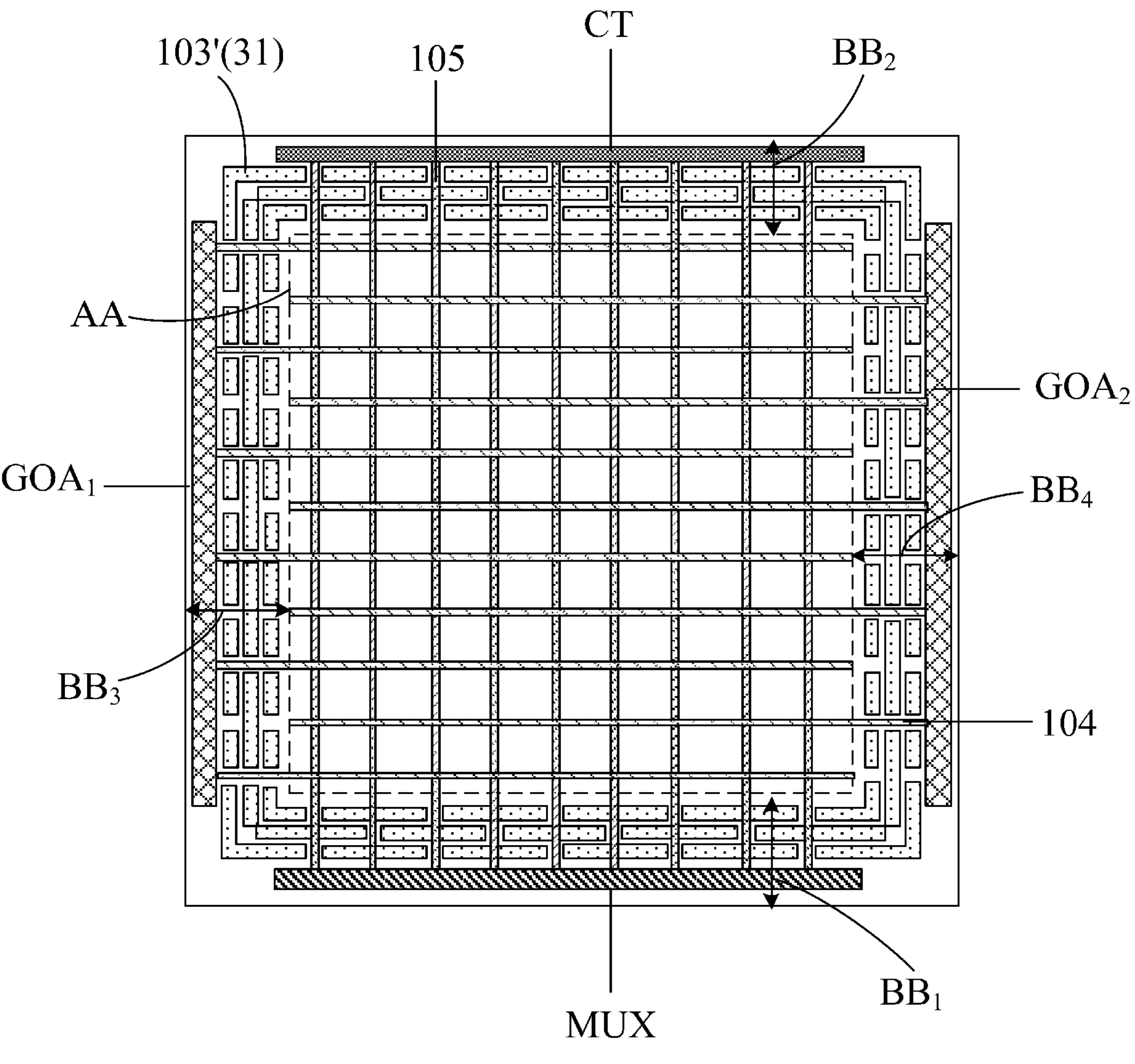
FIG. 8 is yet another schematic structural diagram of a display substrate provided by an embodiment of the present disclosure.
Figure 9:
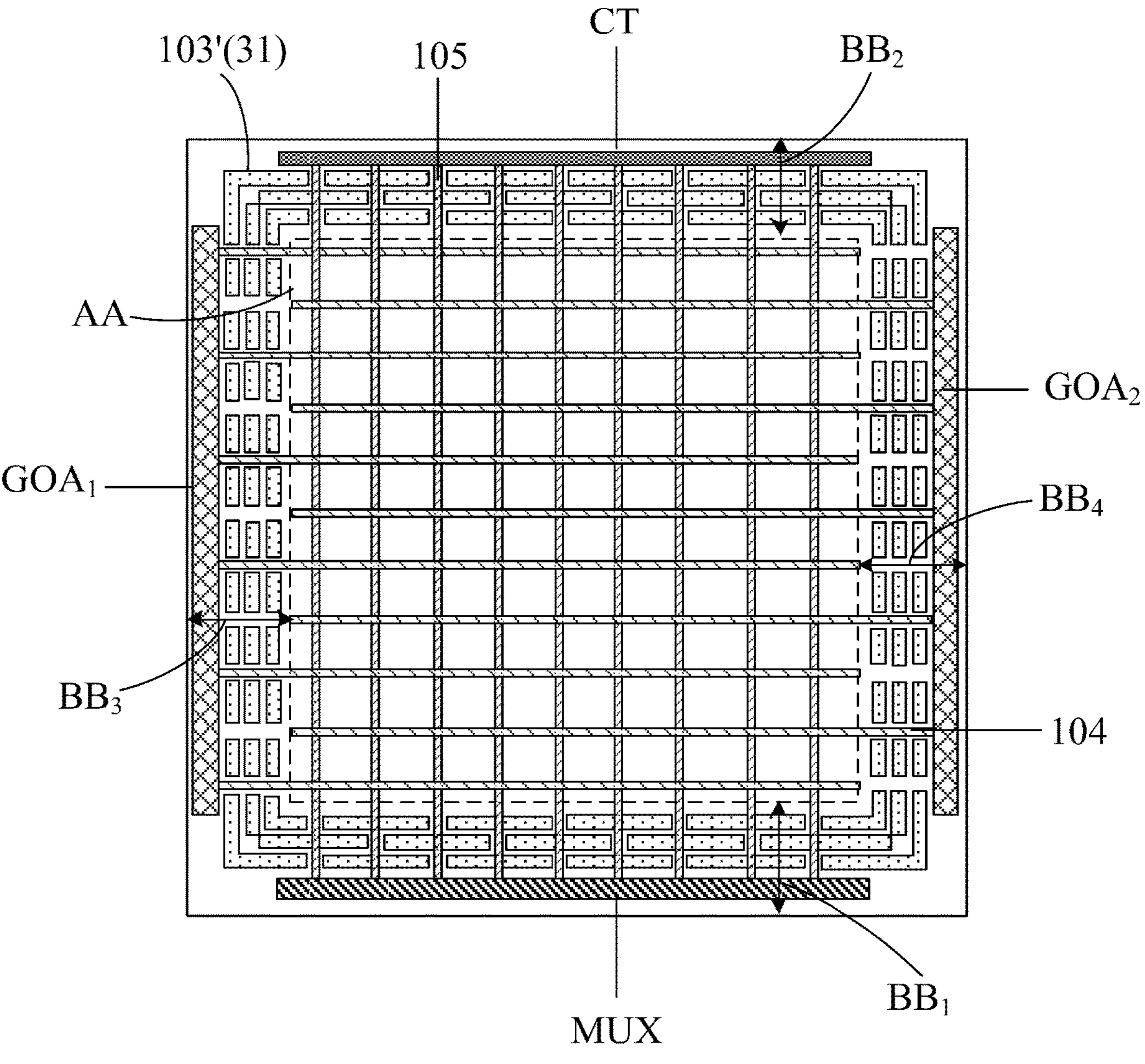
FIG. 9 is yet another schematic structural diagram of a display substrate provided by an embodiment of the present disclosure.

In some embodiments, in the above display substrate provided by the embodiment of the present disclosure, the protective structure 103 may be in the same layer as and is made of the same material as the gate 21, in this case, as shown in FIG. 8 and FIG. 9, in the first frame region $BB_1$ and the second frame region $BB_2$, the disconnected positions of at least parts of the first sub-protective structures 31 are staggered; and in the third frame region $BB_3$ and the fourth frame region $BB_4$, at least parts of the disconnected positions of each first sub-protective structure 31 are provided in a direct facing mode, the gate line 104 extends to at least parts of the disconnected positions which are provided in a direct facing mode and is not in contact with the protective parts 103', and different gate lines 104 are prevented from being short-circuited through the protective parts 103'. The above arrangement mode may ensure that the uniformity of the catalyst concentration of the region where the first sub-protective structures 31 are located is good in the first frame region $BB_1$ and the second frame region $BB_2$, and meanwhile may ensure that a difference between the catalyst concentration of the region where the first sub-protective structures 31 are located in the third frame region $BB_3$ and the fourth frame region $BB_4$ and the catalyst concentration of the region where the first sub-protective structures 31 are located in the first frame region $BB_1$ and the second frame region $BB_2$ is small as much as possible, so that the catalyst concentration around the display region AA is low in the development process, the catalyst concentration around the display region AA is prevented from affecting the catalyst concentration of the display region AA, and a normal development effect of the display region AA is ensured.

In some embodiments, in the above display substrate provided by the embodiment of the present disclosure, the protective structure 103 may be in the same layer as and is made of the same material as the first electrode 22, in this case, as shown in FIG. 10, in the first frame region $BB_1$ and the second frame region $BB_2$, the disconnected positions of all the first sub-protective structures 31 are provided in a direct facing mode, the data line 105 extends to at least parts of the disconnected positions which are provided in a direct facing mode and is not in contact with the protective parts 103', and different data lines 105 are prevented from being short-circuited through the protective parts 103'; and in the third frame region $BB_3$ and the fourth frame region $BB_4$, the disconnected positions of at least parts of the first sub-protective structures 31 are staggered. The above arrangement mode may ensure that the uniformity of the catalyst concentration of the region where the first sub-protective structures 31 are located is good in the third frame region $BB_3$ and the fourth frame region $BB_4$, and meanwhile may ensure that a difference between the catalyst concentration of the region where the first sub-protective structures 31 are located in the first frame region $BB_1$ and the second frame region $BB_2$ and the catalyst concentration of the region where the first sub-protective structures 31 are located in the third frame region $BB_3$ and the fourth frame region $BB_4$ is small as much as possible, so that the catalyst concentration around the display region AA is low in the development process, the catalyst concentration around the display region AA is prevented from affecting the catalyst concentration of the display region AA, and the normal development effect of the display region AA is ensured.

In some embodiments, in the above display substrate provided by the embodiment of the present disclosure, in a case that a distribution density of the protective structure 103 in the frame region (such as $BB_1$, $BB_2$, $BB_3$ and $BB_4$) is approximately the same as a distribution density of the gate 21, the first electrode 22 or the active layer 23 provided in the same layer in the display region AA, in the development process, the catalyst density of the region where the protective structure 103 is located may be equivalent to the catalyst density of the display region AA, so that a catalyst in the region where the protective structure 103 is located may not penetrate into the display region AA, and the display region AA can be developed according to the normal catalyst density, and cannot generate a badness of line breakage. In order to facilitate the calculation of the distribution density of the protective structure 103 and simplify a making process of the protective structure 103, as shown in FIG. 6 to FIG. 10, an orthographic projection of the protective structure 103 in the frame region (such as $BB_1$, $BB_2$, $BB_3$ or $BB_4$) on one side on the base substrate 101 may be set as a straight line, which is equivalent to a shape of orthographic projections of the protective parts 103' on the base substrate 101 as a straight line. Of course, in some embodiments, the shape of the orthographic projections of the protective parts 103' on the base substrate 101 may be a curve, a polyline, or any combination of the straight line, the curve and the polyline, which is not limited here.

It should be noted that in the embodiments provided by the present disclosure, due to the limitation of process conditions or the influence of other factors such as measurement, "approximately the same" may be completely identical, or there may be some deviations (such as a deviation of ±5%), so the relationship of "approximately the same"

between the relevant features, as long as the error is allowed, belongs to the scope of protection of the present disclosure.

In some embodiments, in the above display substrate provided by the embodiment of the present disclosure, the protective structure 103 and the gate 21, the first electrode 22 or the active layer 23 in the same layer meet the following relational expression:

$$\frac{S_{TFT}}{S_{Pixel}} = \frac{W}{W+S};$$

wherein, $S_{TFT}$ represents an area of an orthographic projection of the gate 21, the first electrode 22 or the active layer 23 in the same layer as the protective structure 103 contained in a single pixel in the display region AA on the base substrate 101, $S_{pixel}$ represents an area of the single pixel, W represents a line width of each protective part 103', S represents a spacing distance between two adjacent first sub-protective structures 31 in a direction away from the display region AA, $$\frac{S_{TFT}}{S_{Pixel}}$$

represents a distribution density of the gate 21, the first electrode 22 or the active layer 23, that are in the display region AA, in the same layer as the protective structure 103, and $$\frac{W}{W+S}$$

represents a distribution density of the first sub-protective structures 31 in the region where the protective structure 103 is located. In a case that the above relational expression is met, it may be ensured that the distribution density of the first sub-protective structures 31 is the same as the distribution density of the gate 21, the first electrode 22 or the active layer 23 provided in the same layer as the first sub-protective structures in the display region AA.

Optionally, the single pixel in the present disclosure is one display unit, which may include red, green and blue sub-pixels. The line width W of the protective parts 103' may be 3 μm, and the spacing distance S between two adjacent first sub-protective structures 31 may be 2 μm. In addition, in order to avoid the excessive distance between the display region AA and the protective structure 103 resulting in the excessive catalyst density between the display region and the protective structure 103, a distance between the first sub-protective structure 31 closest to the display region AA and the display region AA may be a minimum size of 2 μm that may be made. In a case that there is no element interfering with the first sub-protective structures 31 within a range around the display region AA and with a distance a from the display region AA, a quantity of the first sub-protective structures 31 is (a–2)/5, wherein a is a width of the display region AA affected by the diffraction light. In a case that (a–2)/5 is a decimal, the quantity of the first sub-protective structures 31 may be determined by rounding.

In some embodiments, the above display substrate provided by the embodiment of the present disclosure, as shown in FIG. 12 and FIG. 13, may further include an electrostatic ring 106, and an orthographic projection of the electrostatic ring 106 on the base substrate 101 may be located in an orthographic projection of a gap of the first sub-protective structures 31 on the base substrate 101. The electrostatic ring 106 may prevent static electricity from entering the display region AA and affecting the display effect. During specific implementation, the reasonable quantity of first sub-protective structures 31 may be provided in a space according to a size of the space between the electrostatic ring 106 and the display region AA. For example, in FIG. 12, two first sub-protective structures 31 are provided in the space between the electrostatic ring 106 and the display region AA, and in FIG. 13, one first sub-protective structure 31 is provided in the space between the electrostatic ring 106 and the display region AA. Optionally, the electrostatic ring 106 may include a first electrostatic part provided in the same layer as the first electrode 22, and a second electrostatic part provided in the same layer as the active layer 23, and the first electrostatic part and the second electrostatic part of the same electrostatic ring 106 are electrically connected.

Since four corner positions of the display region AA are affected by the diffraction light in a long side direction and a short side direction at the same time, the diffraction light in these two directions may be superimposed at the same corner position, resulting in higher light intensity at the four corner positions than that of the light diffracted by one side, and film layers (such as the active layer) at the four corner positions may be thinner or even cracked. In addition, since the active layer is not designed on outer sides of the four corner positions of the display region AA, large-area development is formed in the region, and a high-density catalyst is generated. In the development process, due to the influence of permeation, the catalyst density in the display region AA gradually increases, and excessive development may also cause the active layer and the like at the four corner positions to crack.

Figure 14:
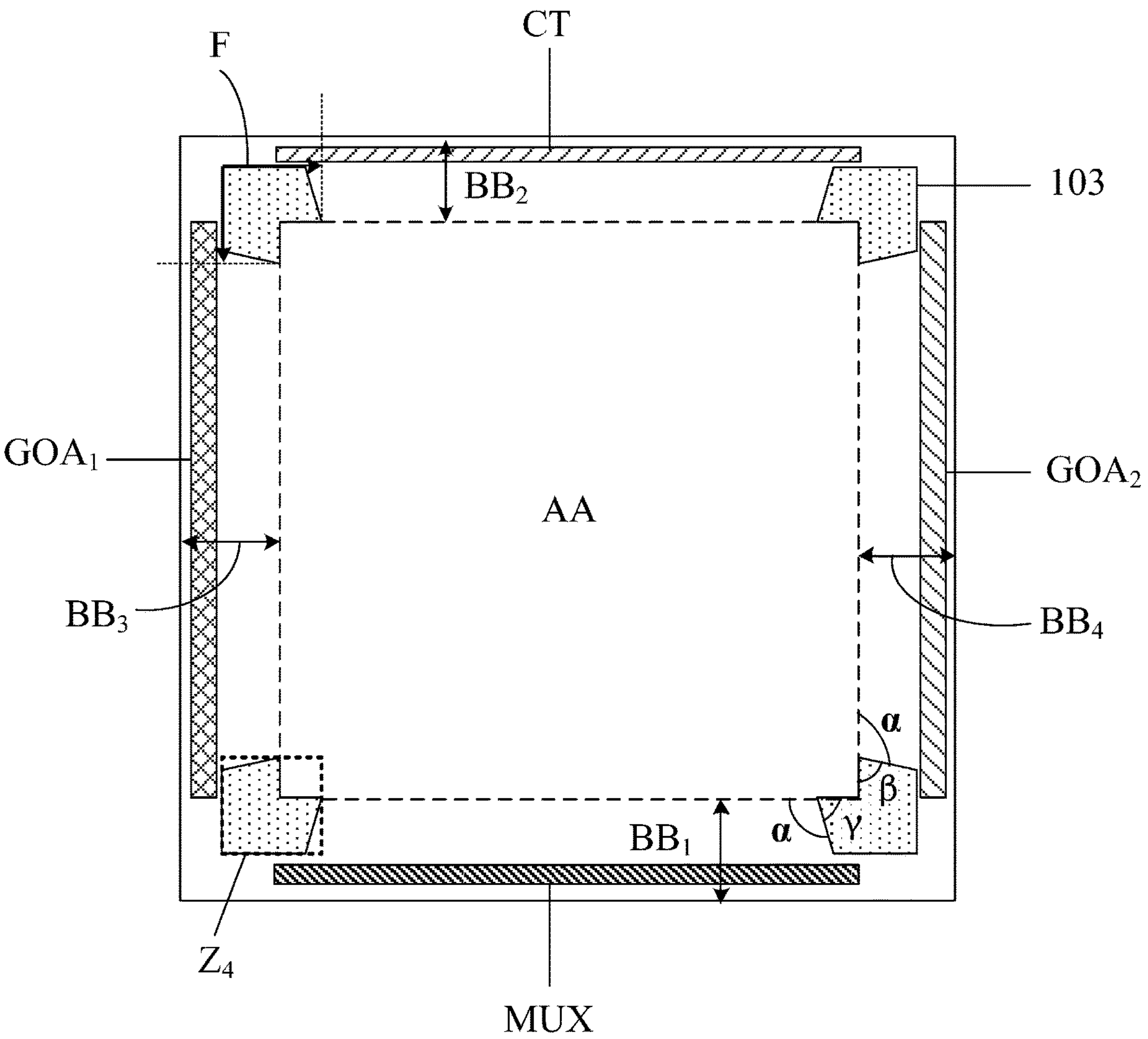
FIG. 14 is yet another schematic structural diagram of a display substrate provided by an embodiment of the present disclosure.
Figure 15:
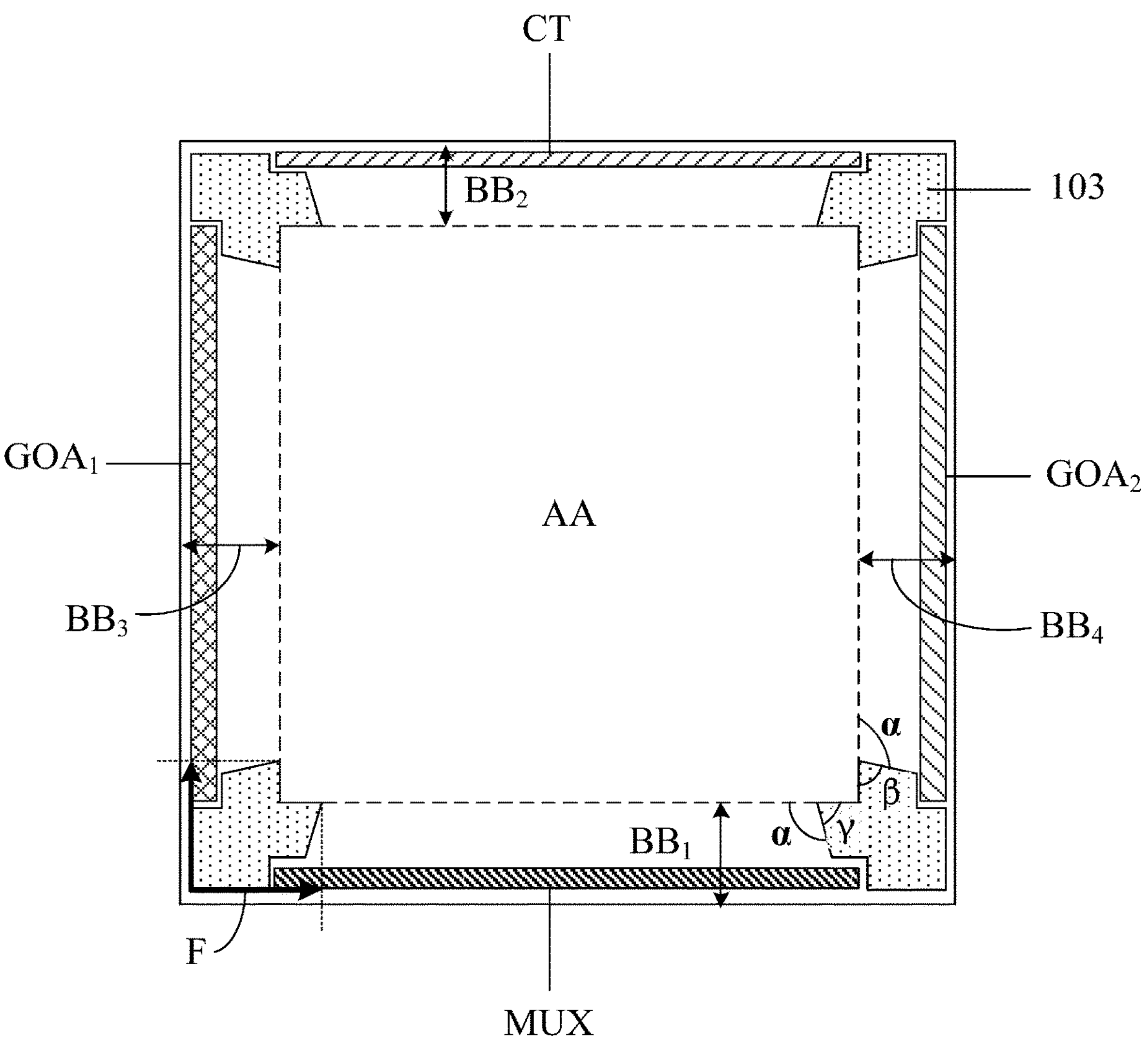
FIG. 15 is yet another schematic structural diagram of a display substrate provided by an embodiment of the present disclosure.

Based on this, in the above display substrate provided by the embodiment of the present disclosure, as shown in FIG. 14 and FIG. 15, the frame region (such as $BB_1$, $BB_2$, $BB_3$ and $BB_4$) surrounds the display region AA, and a shape of the frame region (such as $BB_1$, $BB_2$, $BB_3$ and $BB_4$) is a rectangle hollowed out in the display region AA; and the protective structure 103 is provided around four corners of the display region AA at four corner positions of the rectangle. In this way, the four corner positions of the display region AA may be effectively protected and isolated through the protective structure 103, and the line breakage probability in the active layer 23, the gate 21, the first electrode 22 and the like, that are in the display region AA, in the same layer as the protective structure 103 is significantly reduced. Optionally, since there is no active layer pattern design at the four corner positions of the frame region (such as $BB_1$, $BB_2$, $BB_3$ and $BB_4$) in the related art, as shown in FIG. 14 and FIG. 15, the protective structure 103 located at the four corner positions of the frame region (such as $BB_1$, $BB_2$, $BB_3$, and $BB_4$) may be expanded externally to be flush with boundaries of a region where the first gate driving circuit $GOA_1$ is located, a region where the second gate driving circuit $GOA_2$ is located, a region where the multiplexing circuit MUX is located and a region where the testing circuit CT is located away from the display region AA, and even may exceed the boundaries of the region where the first gate driving circuit $GOA_1$ is located, the region where the second gate driving circuit $GOA_2$ is located, the region where the multiplexing circuit MUX is located and the region where the testing circuit CT is located away from the display region AA, and the protective structure 103 with a large range may better prevent the four corner positions of the display region AA from generating a badness of line breakage.

Figure 16:
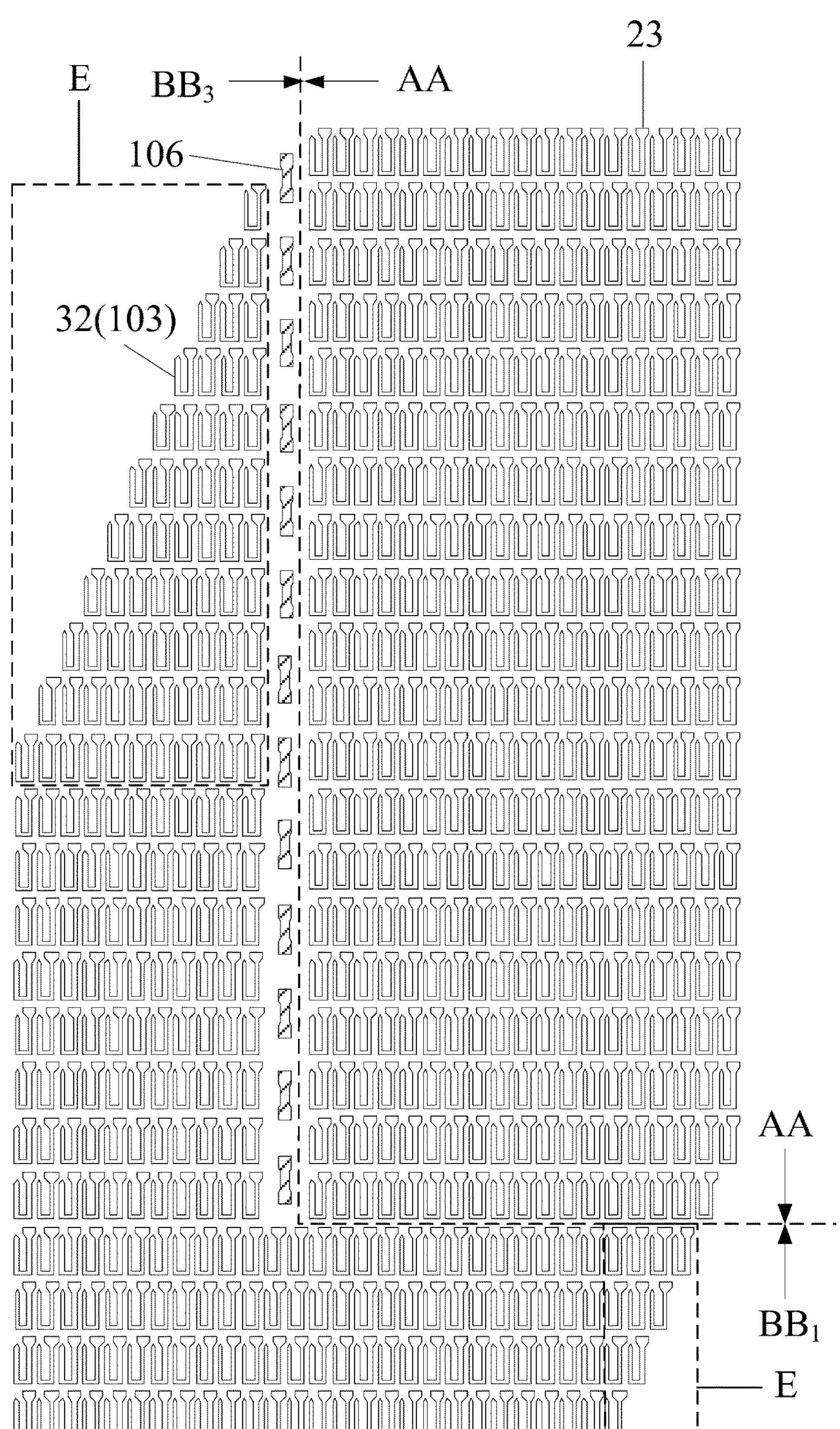
FIG. 16 is an enlarged schematic diagram of a region $Z_4$ in FIG. 14.

In some embodiments, in the above display substrate provided by the embodiment of the present disclosure, as shown in FIG. 16, the protective structure 103 includes a plurality of second sub-protective structures 32, and a distribution density of the second sub-protective structures 32 in the region where the protective structure 103 is located is approximately the same as the distribution density of the gate 21, the first electrode 22 or the active layer 23, that are in the same layer, in the display region. In this way, in the development process, the catalyst density of the region where the protective structure 103 is located is equivalent to the catalyst density of the display region AA, so that the catalyst in the region where the protective structure 103 is located cannot penetrate into the display region, it is ensured that the display region AA can be developed according to the normal catalyst density, and a badness of line breakage may be avoided.

In some embodiments, in the above display substrate provided by the embodiment of the present disclosure, a shape of the second sub-protective structures 32 may be approximately the same as the shape of the gate 21, the first electrode 22 or the active layer 23 provided in the same layer. Optionally, FIG. 16 takes the shape of the second sub-protective structures 32 being approximately the same as the shape of the active layer 23 provided in the same layer as an example for illustration. When the shape of the second sub-protective structures 32 is approximately the same as the shape of the gate 21, the first electrode 22 or the active layer 23 provided in the same layer, the distribution density of the second sub-protective structures 32 in the region where the protective structure 103 is located and the distribution density of the gate 21, the first electrode 22 or the active layer 23 provided in the same layer in the display region AA may be kept completely consistent, so an anti-line-breakage effect of the solution in the development process may be better.

In some embodiments, in the above display substrate provided by the embodiment of the present disclosure, as shown in FIG. 14 and FIG. 15, an included angle between the orthographic projection of the protective structure 103 on the base substrate 101 and sides among the four corners of the display region AA may be an obtuse angle $\alpha$, so that in the development process, the catalyst density from the region where the protective structure 103 is located to the display region AA gradually increases, without causing density mutation, resulting in excessive development of the edge of the display region AA.

In some embodiments, in the above display substrate provided by the embodiment of the present disclosure, as shown in FIG. 16, the frame region on one side (such as $BB_1$, $BB_2$, $BB_3$ and $BB_4$) includes a plurality of rows of second sub-protective structures 32 sequentially provided in the direction away from the display region AA, and at two ends E of an extension direction of the protective structure 103, quantities of the second sub-protective structures 32 in rows are sequentially decreased in the direction away from the display region AA, so as to form an obtuse angle between the orthographic projection of the protective structure 103 on the base substrate 101 and the side of the display region AA. In this case, as shown in FIG. 14 and FIG. 15, an obtuse angle $\alpha$ between the orthographic projection of the protective structure 103 on the base substrate 101 and a side of the display region AA extending in a column direction is equal to $(180°-\beta)$, where $\beta=\arctan(w/p)$, an obtuse angle $\alpha$ between the orthographic projection of the protective structure 103 on the base substrate 101 and a side of the display region AA extending in a row direction is equal to $(180°-\gamma)$, where $\gamma=\arctan(p/w)$, w represents a width of the sub-protective structures 31 decreasing every single row in the row direction, and p represents a length of a single sub-protective structure 31 in the column direction. In a case that the shape of the second sub-protective structures 32 is the same as the shape of the gate 21, the first electrode 22 or the active layer 23 provided in the same layer, the width w is equivalent to a width of a single sub-pixel in the row direction, and the length p is equivalent to a length of a single pixel in the column direction. Optionally, in a case that the single pixel includes the red, green and blue sub-pixels, a width of a single sub-pixel in the row direction may be equal to ⅓ of the width of the single sub-pixel in the row direction, and a length of a single pixel in the column direction may be equal to the length of the single pixel in the column direction.

In some embodiments, in the above display substrate provided by the embodiment of the present disclosure, as shown in FIG. 14 and FIG. 15, a length F of the protective structure 103 in the extension direction of the protective structure is greater than or equal to 2 times the width a (as shown in FIG. 2) in the display region affected by the diffraction light, so that a region affected by the diffraction light is completely located in the region where the protective structure 103 is located, the influence of the diffraction light on the display region AA is effectively avoided, and line breakage in the film layers in the display region AA is avoided.

In some embodiments, in the above display substrate provided by the embodiment of the present disclosure, as shown in FIG. 3, a width K of the protective structure 103 in the direction away from the display region AA is greater than or equal to the width a (as shown in FIG. 2) in the display region AA affected by the diffraction light, the orthographic projection of the protective structure 103 on the base substrate 101 does not overlap an orthographic projection of the multiplexing circuit MUX on the base substrate 101, an orthographic projection of the testing circuit CT on the base substrate 101, an orthographic projection of the first gate driving circuit $GOA_1$ on the base substrate 101 and an orthographic projection of the second gate driving circuit $GOA_2$ on the base substrate 101, so that the region affected by the diffraction light is completely located in the region where the protective structure 103 is located, the influence of the diffraction light on the region where the multiplexing circuit MUX is located, the region where the testing circuit CT is located, the region where the first gate driving circuit $GOA_1$ is located and the region where the second gate driving circuit $GOA_2$ is located is effectively avoided, and line breakage in the film layers in the display region AA, the region where the multiplexing circuit MUX is located, the region where the testing circuit CT is located, the region where the first gate driving circuit $GOA_1$ is located and the region where the second gate driving circuit $GOA_2$ is located is avoided.

Figure 17:
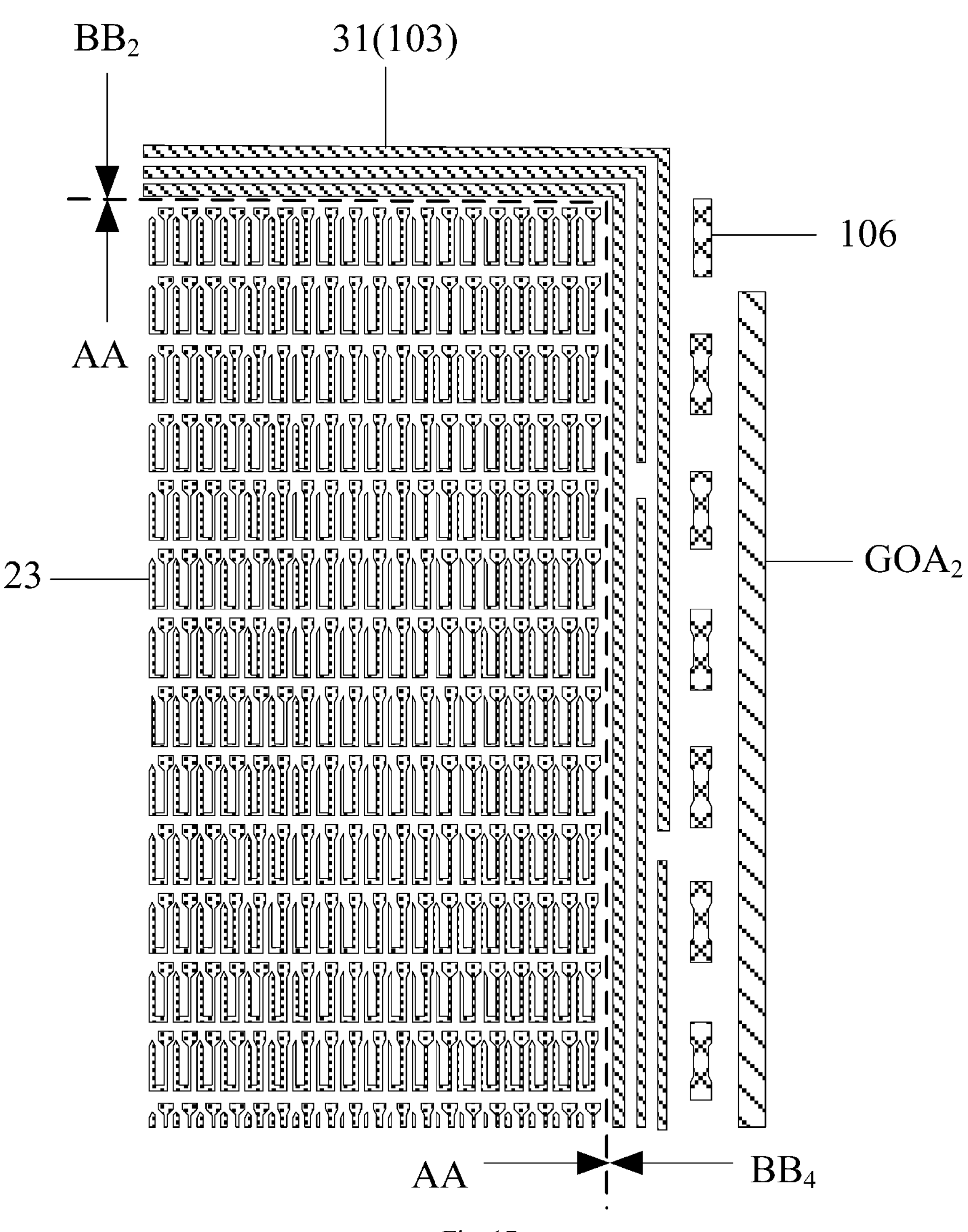
FIG. 17 is an enlarged schematic diagram of a region $Z_5$ in FIG. 6.
Figure 18:
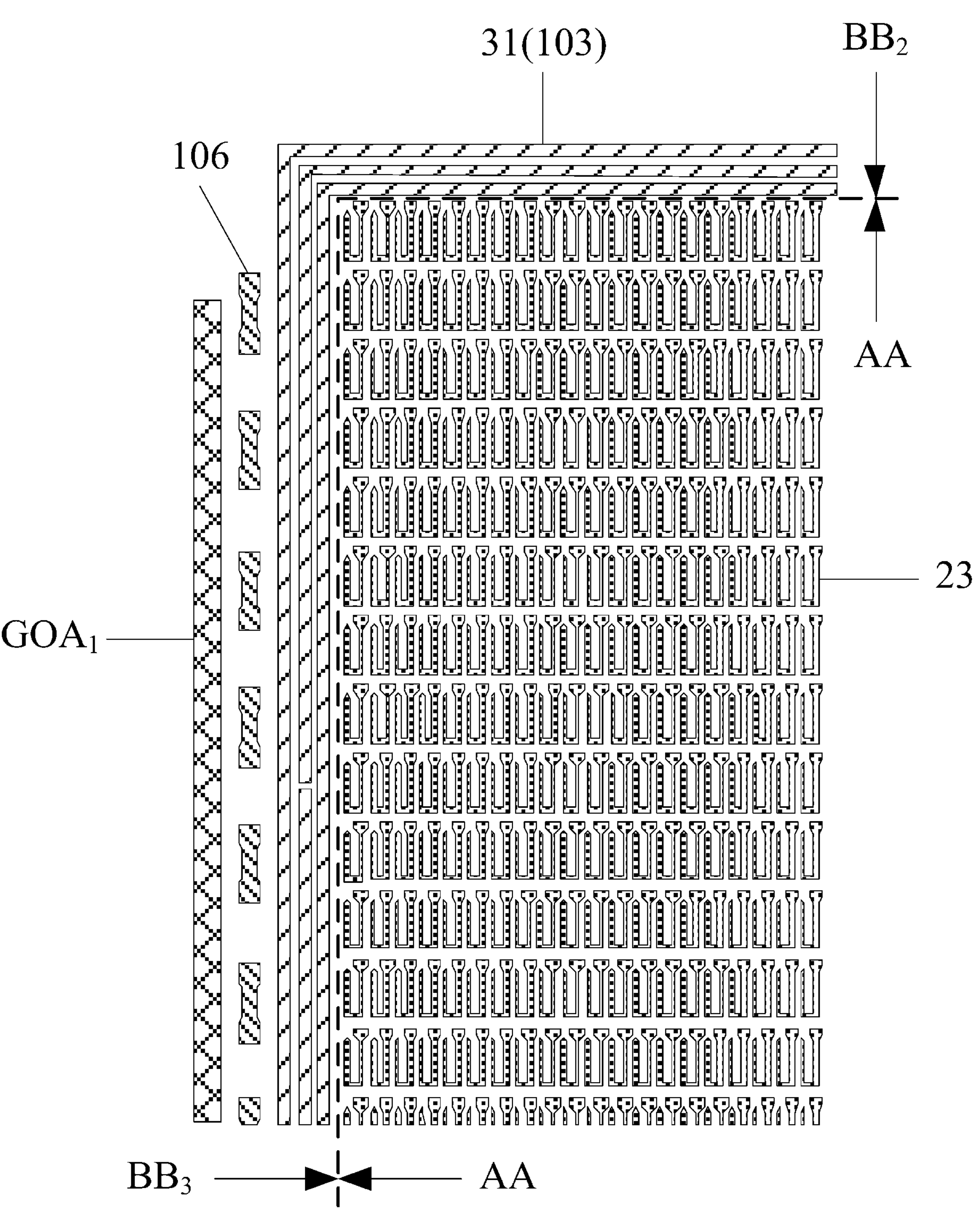
FIG. 18 is an enlarged schematic diagram of a region $Z_6$ in FIG. 6.

In some embodiments, in the above display substrate provided by the embodiment of the present disclosure, the electrostatic ring 106 may be located in the third frame region $BB_3$ and the fourth frame region $BB_4$, in order to facilitate calculation of the distribution density of the first sub-protective structures 31 or the second sub-protective structures 32 in the protective structure 103, and as shown in FIG. 16, an orthographic projection of the electrostatic ring 106 on the base substrate 101 may be set to be located between the orthographic projection of the protective structure 103 on the base substrate 101 and the display region AA; alternatively, as shown in FIG. 17 and FIG. 18, the orthographic projection of the electrostatic ring 106 on the base substrate 101 is set to be located between the orthographic projection of the protective structure 103 on the base substrate 101 and the region where the first gate driving circuit $GOA_1$ is located, and between the orthographic projection of the protective structure 103 on the base substrate 101 and the region where the second gate driving circuit $GOA_2$ is located.

Figure 19:
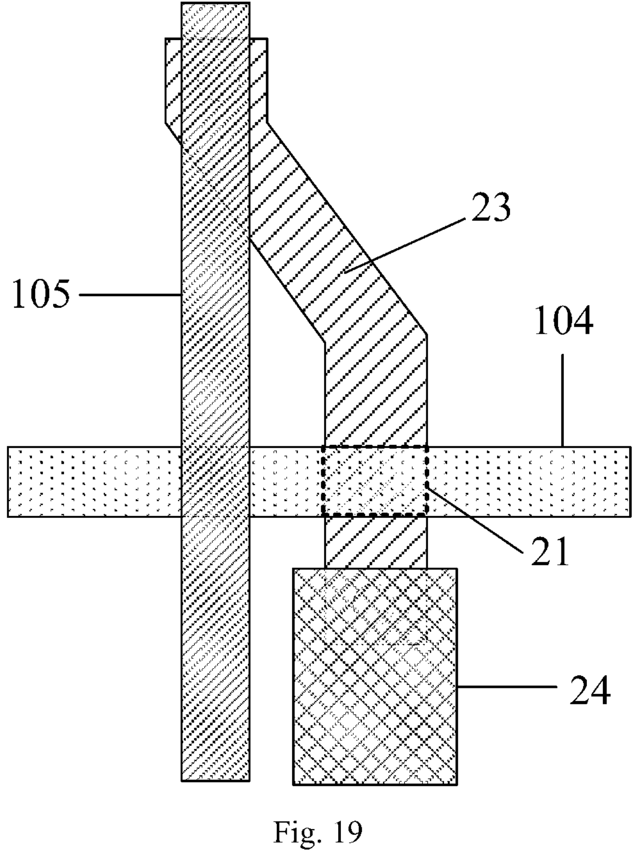
FIG. 19 is yet another schematic structural diagram of one sub-pixel in an effective pixel region provided by an embodiment of the present disclosure.

In some embodiments, in the above display substrate provided by the embodiment of the present disclosure, as shown in FIG. 11 to FIG. 13 and FIG. 16 to FIG. 18, a shape of the orthographic projection of the active layer 23 on the base substrate 101 is approximately a U shape, so that the transistor 102 is of a double-gate structure, and a gate control capability of the transistor 102 is enhanced. Of course, in some embodiments, the shape of the orthographic projection of the active layer 23 on the base substrate 101 may also be a polyline shape and the like shown in FIG. 19, which is not limited here. Optionally, as shown in FIG. 19, the layout of the gate line 104 may be multiplexed as the gate 21. Of course, in some embodiments, the gate 21 may also be provided convex relative to the gate line 104, which is not limited here.

Figure 20:
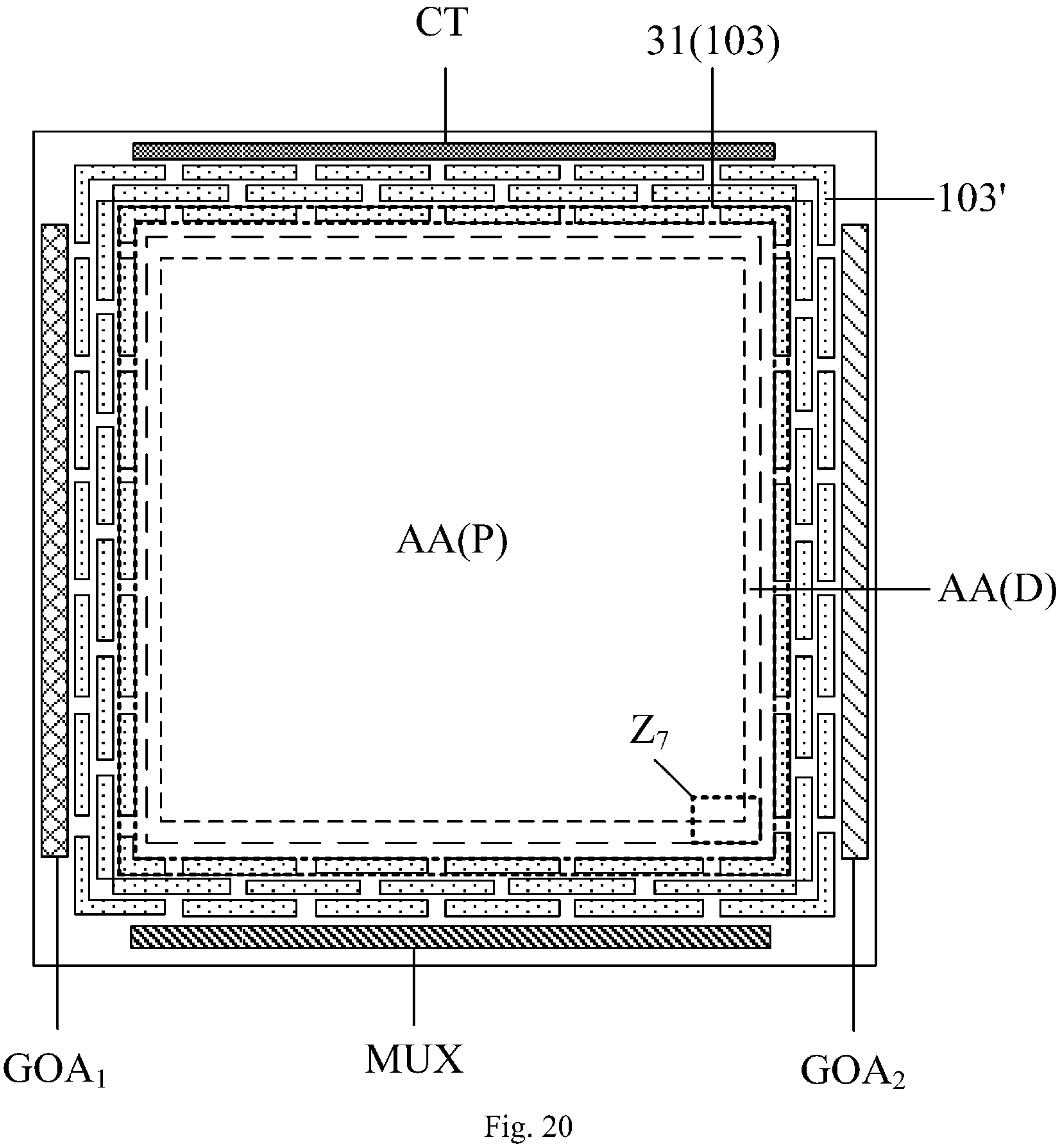
FIG. 20 is yet another schematic structural diagram of a display substrate provided by an embodiment of the present disclosure.
Figure 21:
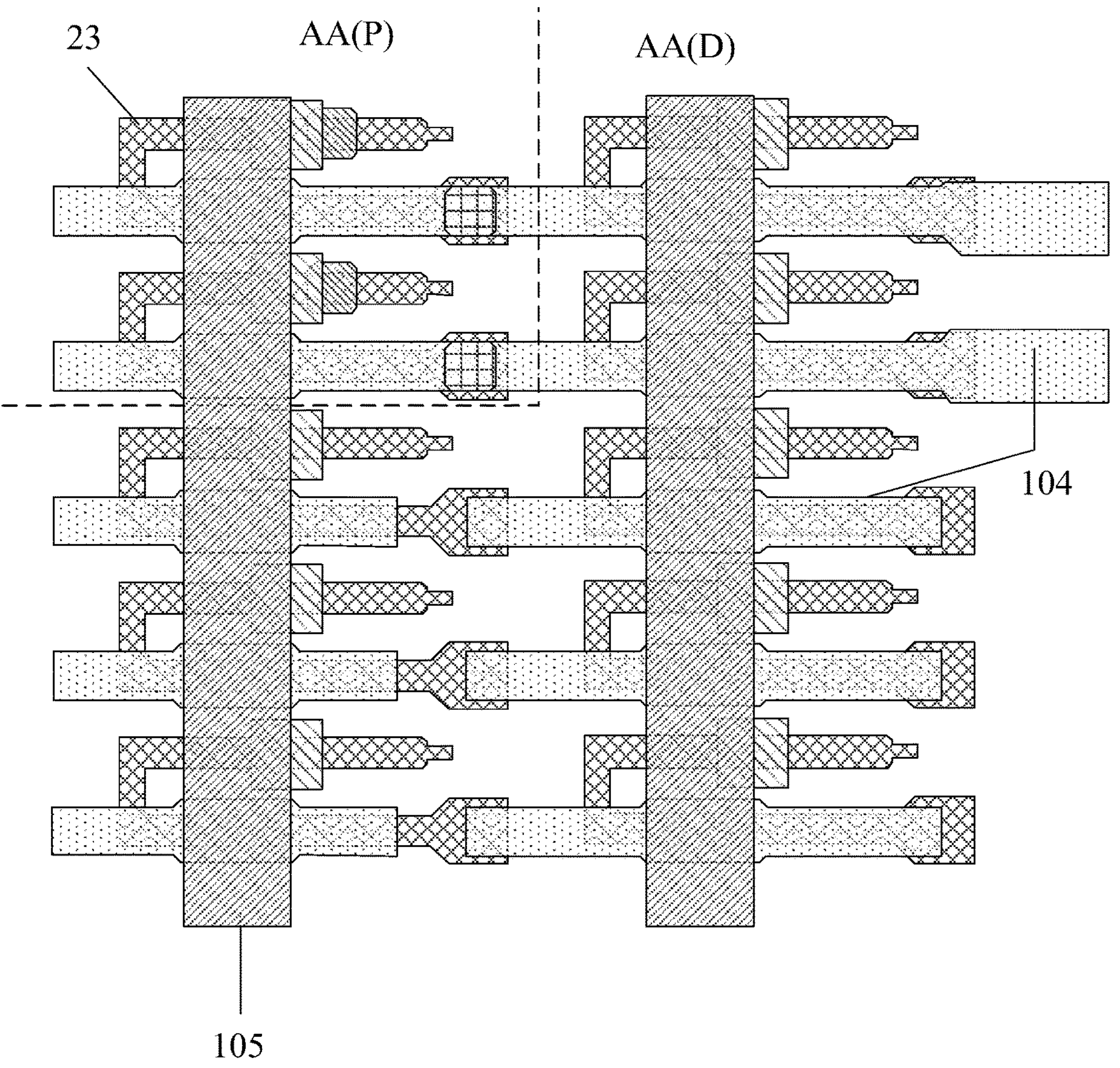
FIG. 21 is an enlarged schematic diagram of a region $Z_7$ in FIG. 20.

In some embodiments, in the above display substrate provided by the embodiment of the present disclosure, as shown in FIG. 20 and FIG. 21, the display region AA includes an effective pixel region P, and a virtual pixel region D surrounding the effective pixel region P; in a transistor 102 in the effective pixel region P, the first electrode 22 is electrically connected with the active layer 23; and in a transistor 102 in the virtual pixel region D, the first electrode 22 is insulated from the active layer 23. During specific implementation, the effective pixel region P may display pictures, the virtual pixel region D cannot display the pictures, and the virtual pixel region D is further used for preventing a badness of line breakage in a film layer of the effective pixel region P.

Figure 22:
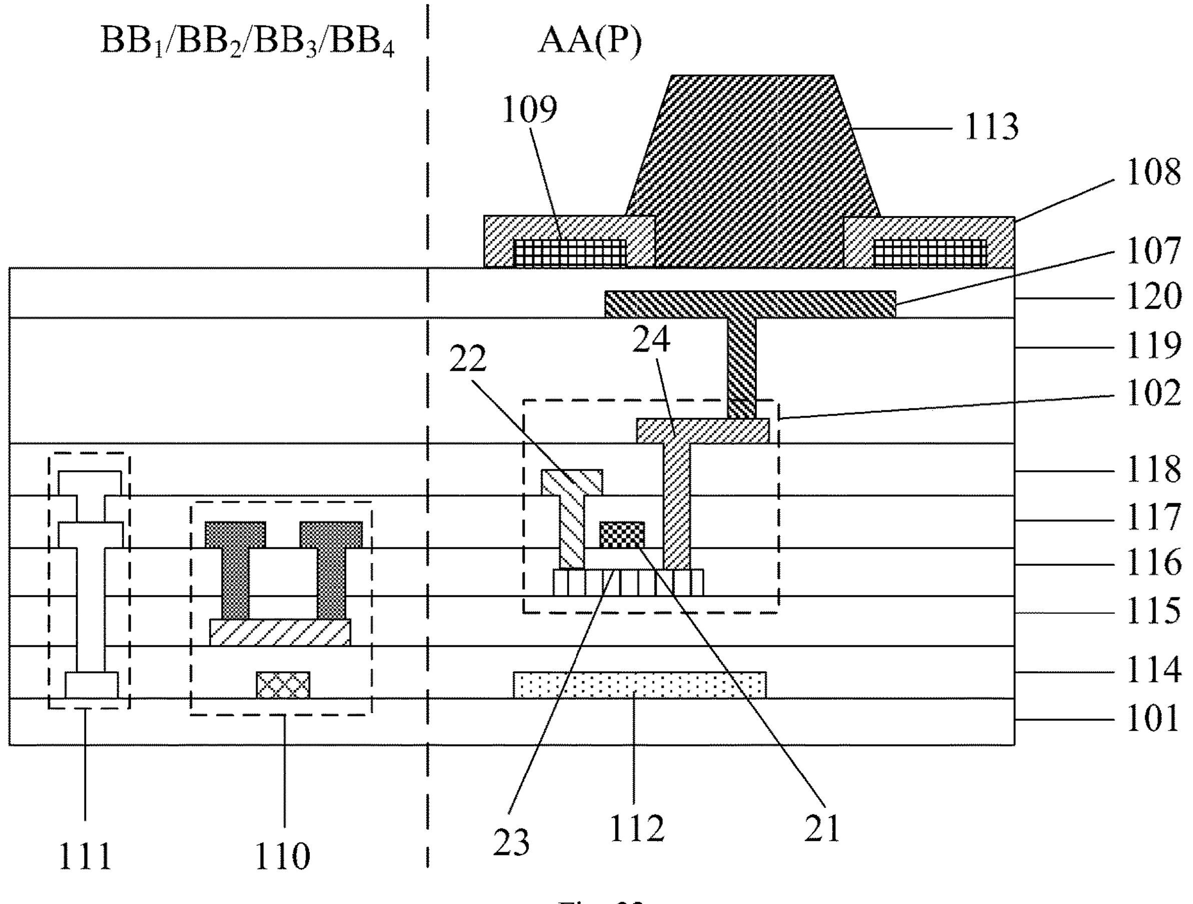
FIG. 22 is yet another schematic structural diagram of a display substrate provided by an embodiment of the present disclosure.

In some embodiments, in the above display substrate provided by the embodiment of the present disclosure, as shown in FIG. 4 and FIG. 22, the transistor 102 in the effective pixel region P may further include a second electrode 24, and the effective pixel region P is further internally provided a pixel electrode 107 electrically connected with the second electrode 24, and a common electrode 108 with an orthographic projection overlapped with the pixel electrode 107. Optionally, it may further include a control line 109 in direct contact with one side of the common electrode 108 facing the base substrate 101, and the control line 109 may load a touch signal and a display drive signal on the common electrode 108 in time, so that the common electrode 108 realizes a touch function and a display function in time. Optionally, the first electrode 22 in the transistor 102 may be a source, and the second electrode 24 thereof may be a drain, or the first electrode 22 in the transistor 102 is a drain, and the second electrode 24 thereof is a source.

Optionally, in order to improve the transmittance, materials of the pixel electrode 107 and the common electrode 108 may include transparent conductive oxides, such as indium tin oxide (ITO), indium zinc oxide (IZO) and zinc oxide (ZnO). In order to further improve the transmittance, the pixel electrode 107 or the common electrode 108 may be a slit electrode. In addition, materials of the control line 109 and the second electrode 24 may be transparent conductive materials such as indium tin oxide (ITO), indium zinc oxide (IZO) and zinc oxide (ZnO), and may also be metal materials or alloy materials, for example, the control line 109 has a single-layer metal structure or a multi-layer metal structure formed by molybdenum, aluminum, titanium and the like, and exemplarily, the multi-layer metal structure is composed of a titanium metal layer, an aluminum metal layer and a titanium metal layer which are provided in a stacked mode.

In the present disclosure, a situation that the pixel electrode 107 and the common electrode 108 are provided on the display substrate at the same time is taken as an example for illustration, in some embodiments, the pixel electrode 107 may also be provided on the display substrate, and the common electrode 108 is provided on an opposite substrate provided opposite to the display substrate. In addition, the present disclosure only shows that the pixel electrode 107 is located between a layer where the common electrode 108 is located and the base substrate 101, and in some embodiments, the common electrode 108 may also be provided to be located between a layer where the pixel electrode 107 is located and the base substrate 101, which is not limited here.

In some embodiments, in the above display substrate provided by the embodiment of the present disclosure, as shown in FIG. 22, the first gate driving circuit $GOA_1$, the second gate driving circuit $GOA_2$, the testing circuit CT or the multiplexing circuit MUX includes a switch pipe 110, optionally, the switch pipe 110 may be a polysilicon transistor of a bottom-gate type, and the transistor 102 is an oxide transistor of a top-gate type. In some embodiments, the switch pipe 110 and the transistor 102 may be the bottom-gate type or the top-gate type at the same time, or one is the bottom-gate type, and the other is the top-gate type, which is not limited here.

Optionally, the switch pipe 110 and the transistor 102 may be a P-type transistor or an N-type transistor, during specific implementation, the switch pipe 110 and the transistor 102 may be the P-type transistor or the N-type transistor at the same time, or one is the P-type transistor, and the other is the N-type transistor, which is not limited here. The P-type transistor is turned on when a voltage difference $V_{gs}$ between its gate and its source and its threshold voltage $V_{th}$ meet a relational expression $V_{gs}<V_{th}$, and is turned off when the voltage difference $V_{gs}$ between its gate and its source and its threshold voltage $V_{th}$ meet a relational expression $V_{gs}\geq V_{th}$. For example, the transistor 102 may be the P-type transistor, the transistor 102 is turned on when a voltage difference $V_{gs1}$ between its gate 21 and its first electrode 22 and its threshold voltage $V_{th1}$ meet a relational expression $V_{gs1}<V_{th1}$, and is turned off when the voltage difference $V_{gs1}$ between its gate 21 and its first electrode 22 and its threshold voltage $V_{th1}$ meet a relational expression $V_{gs}\geq V_{th}$. The N-type transistor is turned on when the voltage difference $V_{gs}$ between its gate and its source and its threshold voltage $V_{th}$ meet a relational expression $V_{gs}>V_{th}$, and is turned off when the voltage difference $V_{gs}$ between its gate and its source and its threshold voltage $V_{th}$ meet a relational expression $V_{gs}\leq V_{th}$. For example, the transistor 102 may be the N-type transistor, the transistor 102 is turned on when the voltage difference $V_{gs1}$ between its gate 21 and its first electrode 22 and its threshold voltage $V_{th1}$ meet a relational expression $V_{gs1}>V_{th1}$, and is turned off when the voltage difference $V_{gs1}$ between its gate 21 and its first electrode 22 and its threshold voltage $V_{th1}$ meet a relational expression $V_{gs}\leq V_{th}$.

In addition, as shown in FIG. 4 and FIG. 22, the display substrate provided by the present disclosure may further include a bonding pad 111 used for being bound with a driving chip (IC), a light shielding layer 112 used for shielding light, a supporting structure 113 used for supporting a spacer (PS) and a gate insulating layer 114, a first interlayer dielectric layer 115, a second interlayer dielectric layer 116, a third interlayer dielectric layer 117, a first insulating layer 118, a flat layer 119, a second insulating layer 120, a buffer layer 121 and the like which play a role of insulating. Other essential components of the display substrate should be understood by ordinarily skilled in the art, and are not repeated here, nor should it be used as a limitation to the present disclosure.

In some embodiments, the light shielding layer 112 may be in the same layer as and is made of the same material as the gate of the switch pipe 110, a material of the light shielding layer 112 may be a metal material or an alloy material, for example, the control line 109 has a single-layer metal structure or a multi-layer metal structure formed by molybdenum, aluminum, titanium and the like, and exemplarily, the multi-layer metal structure is composed of a titanium metal layer, an aluminum metal layer and a titanium metal layer which are provided in a stacked mode.

In some embodiments, materials of the gate insulating layer 114, the first interlayer dielectric layer 115, the second interlayer dielectric layer 116, the third interlayer dielectric layer 117, the first insulating layer 118, the second insulating layer 120 and the buffer layer 121 may include inorganic insulating materials such as silicon oxide, silicon nitride, and silicon nitride. Materials of the supporting structure 113 and the flat layer 119 may include organic insulating materials such as polyimide, polyphthalimide, polyphthalamine, polyacrylic acid resin, polyepoxy-acrylic resin, photosensitive polyimide resin, polyester acrylate, polyurethane acrylate resin, phenolic epoxy acrylic resin, benzocyclobutylene or phenolic resin.

In some embodiments, the bonding pad 111 may be of a stacked structure, optionally, the bonding pad 111 is composed of a first bonding pad part that is in the same layer as and is made of the same material as the light shielding layer 112, a second bonding pad part that is in the same layer as and is made of the same material as the source/drain of the switch pipe 110, and a third bonding pad part that is in the same layer as and is made of the same material as the first electrode 22 of the transistor 102, and the first bonding pad part is electrically connected with the third bonding pad part through the second bonding pad part.

Based on the same inventive concept, an embodiment of the present disclosure further provides a display apparatus, including the above display substrate provided by the embodiment of the present disclosure. Since the principle for solving problems of the display apparatus is similar to that of the above display substrate, implementation of the display apparatus provided by the embodiment of the present disclosure may refer to implementation of the above display substrate, and repetitions will not be made.

Figure 23:
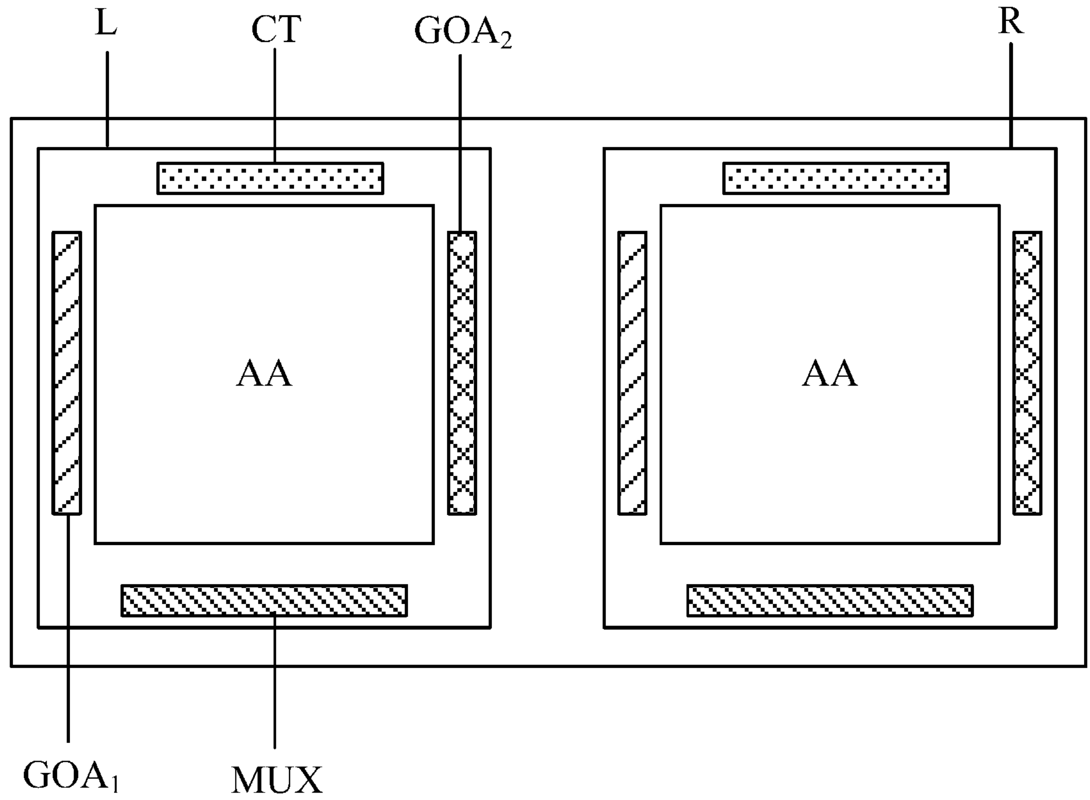
FIG. 23 is a schematic structural diagram of a display apparatus provided by an embodiment of the present disclosure.
Figure 24:
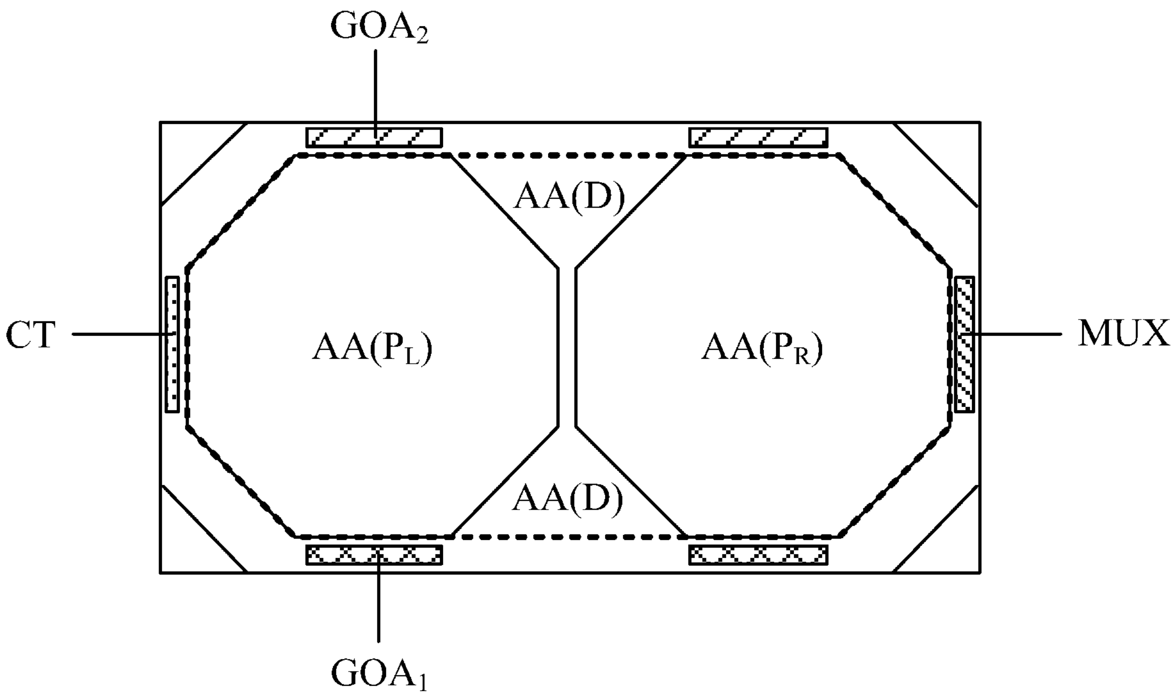
FIG. 24 is yet another schematic structural diagram of a display apparatus provided by an embodiment of the present disclosure.

In some embodiments, the above display apparatus provided by the embodiment of the present disclosure may be applied to a mobile phone, a tablet, a television, a display, a laptop, a digital photo frame, a navigator, a smart watch, a fitness wristband, a personal digital assistant and any other products or components with a display function. FIG. 23 and FIG. 24 specifically show that the display apparatus provided by the present disclosure is applied to virtual reality (VR) glasses. Optionally, virtual reality glasses shown in FIG. 23 include two display screens L and R, different pictures are provided for a left eye and a right eye through the two display screens L and R, and virtual reality display is realized; and the two display screens L and R respectively include the above display substrate provided by the embodiment of the present disclosure. Virtual reality glasses shown in FIG. 24 include a display screen, an effective pixel region P of the display screen includes a left-eye pixel region $P_L$ and a right-eye pixel region $P_R$, and the left-eye pixel region $P_L$ and the right-eye pixel region $P_R$ respectively display different pictures to realize virtual reality display. Optionally, the left-eye pixel region $P_L$ and the right-eye pixel region $P_R$ are right octagonal, and a display region AA is octagonal. In some embodiments, in order to reduce the line breakage probability in the film layers (such as the active layer) in the display region AA, protective structures 103 may be provided around eight sides of the display region AA, or the protective structures 103 are provided on peripheries of eight corners of the display region AA.

In some embodiments, the above display apparatus provided by the embodiment of the present disclosure may be a liquid crystal display screen. The liquid crystal display screen may include a backlight module and a display panel located on a light emitting side of the backlight module. The display panel includes a display substrate and an opposite substrate which are oppositely provided, and a liquid crystal layer located between the display substrate and the opposite substrate, a sealing adhesive surrounding the liquid crystal layer between the display substrate and the opposite substrate, a first alignment layer located on one side of the display substrate close to the liquid crystal layer, a second alignment layer located on one side of the opposite substrate close to the liquid crystal layer, a first polarizer located on one side of the display substrate away from the liquid crystal layer, a second polarizer located on one side of the opposite substrate away from the liquid crystal layer and the like. The backlight module may be a direct-type backlight module, and may also be a side-entry backlight module. The backlight module may include a light source, reflectors provided in a stacked mode, a light guide plate, a diffuser, a prism group and the like. The light source may be a light emitting diode (LED), such as a miniature light emitting diode (Mini LED, Micro LED and the like).

Submillimeter or even micrometer miniature light emitting diodes belong to self-light-emitting devices like organic light emitting diodes (OLEDs). Like the organic light emitting diodes, it has a series of advantages such as high brightness, ultra-low delay and ultra-large viewing angle. In addition, since inorganic light emitting diodes emit light based on metal semiconductors with more stable properties and lower resistance, they have the advantages of lower power consumption, higher resistance to high and low temperatures, and longer service lives compared with the organic light emitting diodes that emit light based on organic matters. In addition, when a miniature light emitting diode is used as a backlight source, a more precise dynamic backlight effect can be realized, the brightness and contrast of a screen are effectively improved, meanwhile a glare phenomenon caused by traditional dynamic backlight between bright and dark regions of the screen can further be solved, and visual experience is optimized.

In some embodiments, the above display apparatus provided by the embodiment of the present disclosure may include but is not limited to: a radio frequency unit, a network module, an audio output & input unit, a sensor, a display unit, a user input unit, an interface unit, a control chip and other components. Optionally, the control chip is a central processing unit, a digital signal processor, a system chip (SoC) and the like. For example, the control chip may further include a memory, a power supply module and the like, and power supply and signal input and output functions are realized through additionally provided wires, signal lines and the like. For example, the control chip may further include a hardware circuit, a computer executable code and the like. The hardware circuit may include a conventional very large-scale integration (VLSI) circuit or array, and an existing semiconductor such as a logic chip and a transistor or other discrete elements; and the hardware circuit may further include a field programmable gate array, a programmable array logic, a programmable logic device and the like.

In addition, those skilled in the art may understand that the above structure does not constitute a limitation of the above display apparatus provided by the embodiment of the present disclosure. In other words, the above display apparatus provided by the embodiment of the present disclosure may include more or less components, or combine some components, or different component arrangements.

Although preferred embodiments have been described in the present disclosure, it should be understood that those skilled in the art may make various modifications and variations to the embodiments of the present disclosure without departing from the spirit and scope of the embodiments of the present disclosure. In this way, under the condition that these modifications and variations to the embodiments of the present disclosure fall within the scope of the claims of the present disclosure and their equivalent technologies, the present disclosure is also intended to include these modifications and variations.

What is claimed is:

1. A display substrate, comprising:

a base substrate, comprising a display region and a frame region on at least one side of the display region;

a transistor on the base substrate, wherein the transistor is in the display region, and comprises a gate, a first electrode, and an active layer; and a protective structure on the base substrate, wherein the protective structure is provided in the frame region and close to the display region, and the protective structure is in the same layer as and is made of the same material as at least one of the active layer, the gate or the first electrode;

wherein the frame region comprises: a first frame region and a second frame region which are provided oppositely, and a third frame region and a fourth frame region which are provided oppositely, the third frame region is connected with the first frame region and the second frame region, and the fourth frame region is connected with the first frame region and the second frame region; the first frame region comprises a multiplexing circuit, the second frame region comprises a testing circuit, the third frame region comprises a first gate driving circuit, and the fourth frame region comprises a second gate driving circuit; and a width of the protective structure in a direction away from the display region is greater than or equal to a width of the display region affected by diffraction light, and an orthographic projection of the protective structure on the base substrate does not overlap an orthographic projection of the multiplexing circuit on the base substrate, an orthographic projection of the testing circuit on the base substrate, an orthographic projection of the first gate driving circuit on the base substrate and an orthographic projection of the second gate driving circuit on the base substrate.

2. The display substrate according to claim 1, wherein the frame region surrounds the display region, and the protective structure in the frame region surrounds the display region.

3. The display substrate according to claim 2, further comprising:

a gate line that is in the same layer as and is made of the same material as the gate, and a data line that is in the same layer as and is made of the same material as the first electrode, an extension direction of the gate line intersects with an extension direction of the data line, the gate line penetrates through the display region and extends to the third frame region and/or the fourth frame region, and the data line penetrates through the display region and extends to the first frame region and the second frame region; and the protective structure comprises a plurality of protective parts disconnected with one another in an extension direction of the protective structure; in the first frame region and the second frame region, orthographic projections of at least parts of disconnected positions between the protective parts on the base substrate overlap an orthographic projection of the data line on the base substrate; and in the third frame region and the fourth frame region, orthographic projections of at least parts of the disconnected positions between the protective parts on the base substrate overlap an orthographic projection of the gate line on the base substrate.

4. The display substrate according to claim 3, wherein the protective structure comprises: a plurality of first sub-protective structures sequentially provided at intervals in the direction away from the display region, and in at least one of the first frame region, the second frame region, the third frame region or the fourth frame region, disconnected positions of at least parts of the first sub-protective structures are staggered.

5. The display substrate according to claim 4, wherein in at least one of the first frame region, the second frame region, the third frame region or the fourth frame region, disconnected positions of adjacent first sub-protective structures are staggered.

6. The display substrate according to claim 4, wherein the protective structure is in the same layer as and is made of the same material as the active layer, and in the first frame region, the second frame region, the third frame region and the fourth frame region, the disconnected positions of at least parts of the first sub-protective structures are staggered.

7. The display substrate according to claim 4, wherein the protective structure is in the same layer as and is made of the same material as the gate, and in the first frame region and the second frame region, the disconnected positions of at least parts of the first sub-protective structures are staggered; and in the third frame region and the fourth frame region, at least parts of the disconnected positions of the first sub-protective structures are provided in a direct facing mode, and the gate line extends to at least parts of the disconnected positions which are provided in a direct facing mode and is not in contact with the protective parts; or the protective structure is in the same layer as and is made of the same material as the first electrode, in the first frame region and the second frame region, the disconnected positions of all the first sub-protective structures are provided in a direct facing mode, and the data line extends to at least parts of the disconnected positions which are provided in a direct facing mode and is not in contact with the protective parts; and in the third frame region and the fourth frame region, the disconnected positions of at least parts of the first sub-protective structures are staggered.

8. The display substrate according to claim 4, wherein the protective structure and the active layer, the gate or the first electrode in the same layer meet a following relational expression:

$$\frac{S_{TFT}}{S_{Pixel}} = \frac{W}{W+S};$$

wherein $S_{TFT}$ represents an area of an orthographic projection of the active layer, the gate or the first electrode in the same layer as the protective structure contained in a single pixel in the display region on the base substrate, $S_{pixel}$ represents an area of the single pixel, W represents a line width of each protective part, and S represents a spacing distance between two adjacent first sub-protective structures in the direction away from the display region.

9. The display substrate according to claim 4, further comprising an electrostatic ring, wherein an orthographic projection of the electrostatic ring on the base substrate is in an orthographic projection of a gap of the first sub-protective structures on the base substrate.

10. The display substrate according to claim 5, wherein in at least one of the first frame region, the second frame region, the third frame region or the fourth frame region, disconnected positions of an $n^{th}$ first sub-protective structure in the direction away from the display region are provided in a direct facing mode, and n is an odd or even number.

11. The display substrate according to claim 10, wherein in at least one of the first frame region, the second frame region, the third frame region or the fourth frame region, disconnected positions of all the first sub-protective structures are staggered.

12. The display substrate according to claim 1, wherein the frame region surrounds the display region, and a shape of the frame region is a rectangle hollowed out in the display region; and the protective structure is provided around four corners of the display region at four corner positions of the rectangle.

13. The display substrate according to claim 12, wherein the protective structure comprises a plurality of second sub-protective structures, and a distribution density of the second sub-protective structures in a region where the protective structure is located is approximately the same as a distribution density of the active layer, the gate or the first electrode provided in the same layer in the display region.

14. The display substrate according to claim 12, wherein a length of the protective structure in an extension direction of the protective structure is greater than or equal to 2 times the width of the display region affected by the diffraction light.

15. The display substrate according to claim 13, wherein a shape of the second sub-protective structures is approximately the same as a shape of the active layer, the gate or the first electrode provided in the same layer.

16. The display substrate according to claim 13, wherein an included angle between the orthographic projection of the protective structure on the base substrate and sides among the four corners of the display region is an obtuse angle.

17. The display substrate according to claim 16, wherein the frame region on one side comprises a plurality of rows of second sub-protective structures sequentially provided in the direction away from the display region, and quantities of the second sub-protective structures in the rows in the direction away from the display region are sequentially decreased at two ends of an extension direction of the protective structure.

18. The display substrate according to claim 1, further comprising an electrostatic ring located in the third frame region and the fourth frame region, wherein an orthographic projection of the electrostatic ring on the base substrate is located between the orthographic projection of the protective structure on the base substrate and the display region; or an electrostatic ring located in the third frame region and the fourth frame region, wherein an orthographic projection of the electrostatic ring on the base substrate is located between the orthographic projection of the protective structure on the base substrate and the orthographic projection of the first gate driving circuit on the base substrate, and between the orthographic projection of the protective structure on the base substrate and the orthographic projection of the second gate driving circuit on the base substrate.

19. A display apparatus, comprising the display substrate according to claim 1.

20. The display substrate according to claim 1, wherein a shape of an orthographic projection of the active layer on the base substrate is approximately a U shape or a polyline shape.

* * * * *